United States Patent
Furuya et al.

(10) Patent No.: US 8,298,745 B2
(45) Date of Patent: Oct. 30, 2012

(54) POLYMERIC COMPOUND, POSITIVE RESIST COMPOSITION, AND METHOD OF FORMING RESIST PATTERN

(75) Inventors: Sanae Furuya, Kawasaki (JP); Takahiro Dazai, Kawasaki (JP); Shinichi Kohno, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 199 days.

(21) Appl. No.: 12/451,971

(22) PCT Filed: Jun. 11, 2008

(86) PCT No.: PCT/JP2008/060694
§ 371 (c)(1), (2), (4) Date: Dec. 10, 2009

(87) PCT Pub. No.: WO2008/153066
PCT Pub. Date: Dec. 18, 2008

(65) Prior Publication Data
US 2010/0124718 A1    May 20, 2010

(30) Foreign Application Priority Data
Jun. 13, 2007  (JP) .................. P2007-156362

(51) Int. Cl.
G03F 7/004 (2006.01)
G03F 7/30 (2006.01)
C08F 32/02 (2006.01)

(52) U.S. Cl. ............. 430/270.1; 430/326; 430/910; 526/308; 526/309

(58) Field of Classification Search ......... 430/270.1, 430/326, 910; 526/308, 309
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 6,280,897 B1 | 8/2001 | Asakawa et al. | |
| 6,686,413 B2 * | 2/2004 | Nakamura et al. | 524/553 |
| 7,074,543 B2 | 7/2006 | Iwai et al. | |
| 7,674,567 B2 * | 3/2010 | Yamamoto et al. | 430/270.1 |
| 7,842,452 B2 * | 11/2010 | Kanna et al. | 430/326 |
| 7,851,140 B2 * | 12/2010 | Tsubaki | 430/325 |
| 7,998,654 B2 * | 8/2011 | Nishiyama et al. | 430/270.1 |
| 2006/0216643 A1 | 9/2006 | Li et al. | |
| 2008/0166655 A1 | 7/2008 | Ogata et al. | |
| 2008/0233514 A1 * | 9/2008 | Li et al. | 430/270.1 |
| 2010/0062369 A1 * | 3/2010 | Dazai et al. | 430/285.1 |

FOREIGN PATENT DOCUMENTS

| | | |
|---|---|---|
| JP | 9-208554 | 8/1997 |
| JP | 11-35551 | 2/1999 |
| JP | 11-35552 | 2/1999 |
| JP | 11-35573 | 2/1999 |
| JP | 11-84663 | 3/1999 |
| JP | 11-322707 | 11/1999 |
| JP | 2003-241385 | 8/2003 |
| JP | 2005-196209 | 7/2005 |
| JP | 2005-227332 | 8/2005 |
| JP | 2005-227646 | 8/2005 |
| JP | 2006-96965 | 4/2006 |
| JP | 2007-112899 | 5/2007 |
| WO | 2004/074242 | 9/2004 |

OTHER PUBLICATIONS

International Search Report issued Jul. 15, 2008 in International (PCT) Application No. PCT/JP2008/060694.

* cited by examiner

*Primary Examiner* — John Chu
(74) *Attorney, Agent, or Firm* — Wenderoth, Lind & Ponack, L.L.P.

(57) ABSTRACT

A polymeric compound including a structural unit (a0) represented by the structural unit (a0-1) shown below:

[Chemical Formula 1]

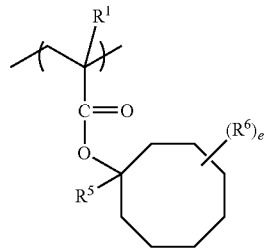

(a0-1)

(in the formula (a0-1), $R^1$ represents a hydrogen atom, a lower alkyl group, or a halogenated lower alkyl group; $R^5$ represents an alkyl group; $R^6$ represents a substituent selected from the group consisting of an alkyl group, an alkoxy group, a halogen atom and a halogenated alkyl group; and e represents an integer of 0 to 5).

5 Claims, No Drawings

POLYMERIC COMPOUND, POSITIVE RESIST COMPOSITION, AND METHOD OF FORMING RESIST PATTERN

TECHNICAL FIELD

The present invention relates to a novel polymeric compound, a novel positive resist composition, and a method of forming a resist pattern using the positive resist composition.

The application claims priority from Japanese Patent Application No. 2007-156362 filed on Jun. 13, 2007, the disclosure of which is incorporated by reference herein.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and a developing treatment is then conducted, thereby forming a resist pattern of the prescribed shape in the resist film. These resist materials include positive-type materials in which exposed portions exhibit increased solubility in an alkali developing solution, and negative-type materials in which exposed portions exhibit decreased solubility in an alkali developing solution.

In recent years, in the production of semiconductor elements and liquid crystal display elements, advances in lithography techniques have led to rapid progress in the field of miniaturization. Typically, these miniaturization techniques involve shortening the wavelength of the exposure light source. Conventionally, ultraviolet radiation typified by g-line and i-line radiation has been used; however, nowadays, KrF excimer lasers and ArF excimer lasers are starting to be introduced in mass production of semiconductor elements. Furthermore, research is also being conducted into lithography techniques that use $F_2$ excimer lasers, electron beams (EB), extreme ultraviolet radiation (EUV) and X-rays.

Resist materials are required to have lithography properties such as high sensitivity to the aforementioned light source and enough resolution to reproduce patterns with very fine dimensions. As resist materials which fulfill the aforementioned requirements, there is used a chemically-amplified resist containing a base resin that displays changed alkali solubility under action of an acid, and an acid generator that generates an acid upon exposure. For example, as the chemically-amplified positive resist, resists containing an acid generator component and a resin component having an acid dissociable, dissolution inhibiting group which dissolves under action of an acid generated from the acid generator are typically used.

Resins (acrylic resins) that contain structural units derived from (meth)acrylate esters within the main chain are now widely used as base resins for resists that use ArF excimer laser lithography, as they exhibit excellent transparency in the vicinity of 193 nm (for example, see Patent Document 1). Here, the term "(meth)acrylic acid" is a generic term that includes either or both of the acrylic acid having a hydrogen atom bonded to the α-position and the methacrylic acid having a methyl group bonded to the α-position. The term "(meth)acrylate ester" is a generic term that includes either or both of an acrylate ester having a hydrogen atom bonded to the α-position and a methacrylate ester having a methyl group bonded to the α-position. The term "(meth)acrylate" is a generic term that includes either or both of an acrylate having a hydrogen atom bonded to the α-position and a methacrylate having a methyl group bonded to the α-position.

When a positive resist is used, resins which have a structural unit derived from a (meth)acrylate ester which has an acid dissociable, dissolution inhibiting group are used as the acrylic resin (see Patent Documents 1 and 2).

Also, as base resins for chemically amplified resists, base resins containing a plurality of structural units are typically used in order to improve lithography properties and the like. For example, in the case of using a positive-type resist, a base resin is typically used which includes the above-mentioned structural unit having an acid dissociable, dissolution inhibiting group, and further includes a structural unit having a polar group such as a hydroxyl group and a structural unit having a lactone structure.

[Patent Document 1] Japanese Unexamined Patent Application, First Publication No. 2003-241385.

[Patent Document 2] Japanese Unexamined Patent Application, First Publication No. 2006-096965.

DISCLOSURE OF THE INVENTION

Problems to be Solved by the Invention

In recent years, as the miniaturization of the resist pattern has progressed more and more, it has been demanded that the resist composition attain higher resolution, and improve various lithography properties more than ever. As an example of such lithography properties, line width roughness (hereafter, frequently abbreviated as "LWR") can be mentioned. LWR is a phenomenon in which the line width of a line pattern becomes uneven (non-uniform) when a resist pattern is formed using a resist composition, and improvement in the level of LWR becomes an important issue as pattern miniaturization progresses.

The present invention takes the above circumstances into consideration, with an object of providing a novel polymeric compound, a positive resist composition, and a method of forming a resist pattern using the positive resist composition.

Means for Solving the Problems

To achieve the above object, the present invention employs the following constitutions.

Specifically, a first aspect of the present invention is a polymeric compound including a structural unit (a0) represented by the general formula (a0-1) shown below.

[Chemical Formula 1]

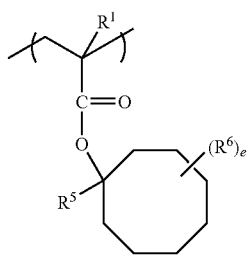

(a0-1)

(In the formula (a0-1), $R^1$ represents a hydrogen atom, a lower alkyl group, or a halogenated lower alkyl group; $R^5$ represents an alkyl group; $R^6$ represents a substituent selected from the group consisting of an alkyl group, an alkoxy group, a halogen atom and a halogenated alkyl group; and e represents an integer of 0 to 5.)

A second aspect of the present invention is a positive resist composition including a base component (A) which exhibits increased solubility in an alkali developing solution under action of an acid, and an acid generator component (B) which generates an acid upon exposure, wherein the base component (A) includes a polymeric compound (A1) containing a structural unit (a0) represented by the general formula (a0-1) shown below.

[Chemical Formula 2]

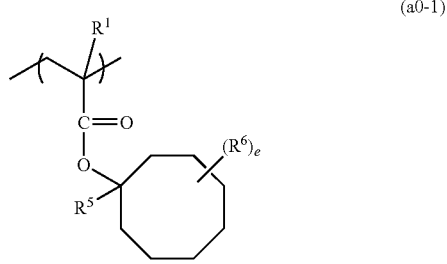

(a0-1)

(In the formula (a0-1), $R^1$ represents a hydrogen atom, a lower alkyl group, or a halogenated lower alkyl group; $R^5$ represents an alkyl group; $R^6$ represents a substituent selected from the group consisting of an alkyl group, an alkoxy group, a halogen atom and a halogenated alkyl group; and e represents an integer of 0 to 5.)

A third aspect of the present invention is a method of forming a resist pattern which includes forming a resist film on a substrate using the positive resist composition of the second aspect of the present invention; exposing the resist film; and developing the resist film with an alkali to form a resist pattern.

In the present specification and claims, the term "structural unit" means a monomer unit that contributes to the formation of a polymeric compound (polymer, copolymer).

The term "alkyl group" is a concept containing a linear, branched and cyclic monovalent saturated hydrocarbon group, unless another definition is particularly provided.

The term "lower alkyl group" means an alkyl group of 1 to 5 carbon atoms.

The term "exposure" is used as a general concept involving irradiation with any form of radiation.

Effects of the Invention

According to the present invention, a novel polymeric compound, a novel positive resist composition, and a method of forming a resist pattern using the positive resist composition can be provided.

BEST MODE FOR CARRYING OUT THE INVENTION

<<Polymeric Compound>>

The polymeric compound (hereinafter, referred to as polymeric compound (A1)) of the present invention includes the structural unit (a0) represented by the general formula (a0-1).
<Structural Unit (a0)>

In the formula (a0-1), specific examples of the lower alkyl group of 1 to 5 carbon atoms for $R^1$ include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

Examples of the halogenated lower alkyl group for $R^1$ include groups in which a part or all of the hydrogen atoms in the above lower alkyl group have been substituted with halogen atoms. Examples of the halogen atoms include a fluorine atom, a chlorine atom, a bromine atom and an iodine atom. Of these, a fluorine atom is particularly preferable.

$R^1$ is preferably a hydrogen atom, a lower alkyl group, or a fluorinated lower alkyl group, and most preferably a hydrogen atom or a methyl group in terms of industrial availability.

The alkyl group for $R^5$ is preferably a linear or branched alkyl group. Also, the alkyl group for $R^5$ preferably has 1 to 5 carbon atoms. Specific examples thereof include the same lower alkyl groups as those described above for $R^1$, and of these, a methyl group or an ethyl group is particularly preferable.

Examples of the alkyl group, and the alkyl group within the alkoxy group for $R^6$ include the same lower alkyl groups as those described above for $R^1$.

Examples of the halogen atom include a fluorine atom, a chlorine atom, a bromine atom and an iodine atom. Of these, a fluorine atom is preferable.

Examples of the halogenated alkyl group include the same halogenated lower alkyl groups as those described above for $R^1$.

e is an integer of 0 to 5, preferably 0 to 2, and most preferably 0.

The structural unit (a0) included in the polymeric compound (A1) may be one type, or may be two or more types.

The polymeric compound (A1) may be a polymer consisting of the structural unit (a0), or a copolymer containing other structural units in addition to the structural unit (a0).

With respect to the proportion of the structural unit (a0) within the polymeric compound (A1), the total proportion of the structural units (a0) and the structural unit (a1) described below (if the polymeric compound (A1) does not include the structural unit (a1), the proportion of the structural unit (a0)) is preferably 10 to 80 mol %, more preferably 20 to 70 mol %, and most preferably 25 to 50 mol %, based on the combined total of all the structural units that constitute the polymeric compound (A1). When this proportion is not less than the lower limit in the above range, then a pattern can be easily formed using a resist composition which includes the structural unit (a0), whereas when the proportion is not more than the upper limit in the above range, a good quantitative balance with the other structural units can be attained.

Particularly, the proportion of the structural unit (a0) is preferably at least 1 mol %, and more preferably at least 5 mol %, based on the combined total of all the structural units that constitute the polymeric compound (A1), because the positive resist composition including the polymeric compound (A1) excels in lithography properties. For example, the positive resist composition including such a polymeric compound (A1) can form a resist pattern with reduced levels of LWR.

If the polymeric compound (A1) of the present invention is a copolymer containing structural units other than the structural unit (a0) in addition to the structural unit (a0), there are no particular limitations on structural units other than the structural unit (a0), and any of structural units used in a base resin for a chemically-amplified resist can be arbitrarily used.

Specific examples thereof include structural units (a1) to (a4) described below.

Of these, the polymeric compound (A1) preferably further contains the structural unit (a2) in addition to the structural unit (a0).

Also, the polymeric compound (A1) preferably further contains the structural unit (a3), in addition to the structural unit (a0) or the structural units (a0) and (a2).

Also, the polymeric compound (A1) preferably further contains the structural unit (a1), in addition to the structural unit (a0), the structural units (a0) and (a2), or the structural units (a0), (a2) and (a3).

<Structural Unit (a1)>

The structural unit (a1) is a structural unit which does not correspond with the above structural unit (a0) and is derived from an acrylate ester which has an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire polymeric compound poorly-soluble in an alkali developing solution prior to dissociation, and then following dissociation by action of an acid, causes the entire polymeric compound (A1) to change to an alkali-soluble state. Generally, groups that form either a cyclic or chain-like tertiary alkyl ester with the carboxyl group of the (meth) acrylic acid or the like; and acetal-type acid dissociable, dissolution inhibiting groups such as alkoxyalkyl groups are widely known. Here, the term "(meth)acrylate ester" is a generic term that includes either or both of an acrylate ester having a hydrogen atom bonded to the α-position and a methacrylate ester having a methyl group bonded to the α-position.

Here, the term "tertiary alkyl ester" means a structure in which an ester is formed by substituting the hydrogen atom of the carboxyl group with a chain-like or cyclic alkyl group, and a tertiary carbon atom within the chain-like or cyclic alkyl group is bonded to the oxygen atom at the terminal of the carbonyloxy group (—C(O)—O—). In the tertiary alkyl ester, the bond between the oxygen atom and the tertiary carbon atom is cleaved under action of an acid.

Here, the chain-like or cyclic alkyl group may contain a substituent.

Hereinafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of the tertiary alkyl ester-type acid dissociable, dissolution inhibiting groups include aliphatic branched, acid dissociable, dissolution inhibiting groups and aliphatic cyclic group-containing acid diccociable, dissolution inhibiting groups.

Here, in the claims and specification, the term "aliphatic" is a relative concept used in relation to the term "aromatic", and defines a group, a compound or the like that contains no aromaticity.

The term "aliphatic branched" means a branched structure having no aromaticity. The "aliphatic branched, acid dissociable, dissolution inhibiting group" is not limited to groups (hydrocarbon groups) composed of carbon atoms and hydrogen atoms, and is preferably a hydrocarbon group. Further, the "hydrocarbon group" may be either saturated or unsaturated, and is preferably saturated.

Examples of aliphatic branched, acid dissociable, dissolution inhibiting groups include tertiary alkyl groups of 4 to 8 carbon atoms, and specific examples include a tert-butyl group, a tert-pentyl group and a tert-heptyl group.

The term "aliphatic cyclic group" means a monocyclic or polycyclic group which has no aromaticity. The aliphatic cyclic group preferably has 5 to 30 carbon atoms.

The "aliphatic cyclic group" within the structural unit (a1) may or may not contain a substituent. Examples of the substituent include a lower alkyl group of 1 to 5 carbon atoms, a fluorine atom, a fluorinated lower alkyl group of 1 to 5 carbon atoms, and an oxygen atom (=O).

The basic ring of the "aliphatic cyclic group" exclusive of the substituent is not limited to groups (hydrocarbon groups) composed of carbon atoms and hydrogen atoms, and is preferably a hydrocarbon group. Further, the "hydrocarbon group" may be either saturated or unsaturated, and is preferably saturated. The "aliphatic cyclic group" is preferably a polycyclic group.

Examples of the aliphatic cyclic groups include groups in which one or more hydrogen atoms have been removed from a monocycloalkane or a polycycloalkane such as a bicycloalkane, tricycloalkane or tetracycloalkane in which a lower alkyl group, a fluorine atom or a fluorinated lower alkyl group may or may not be included as a substituent. Specific examples include groups in which at least one hydrogen atom has been removed from a monocycloalkane such as cyclopentane or cyclohexane; and groups in which at least one hydrogen atom has been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom within the ring skeleton of a cyclic alkyl group can be mentioned. Specific examples thereof include a 2-methyl-2-adamantyl group and a 2-ethyl-2-adamantyl group. Further, groups having an aliphatic cyclic group such as an adamantyl group, a cyclohexyl group, a cyclopentyl group, a norbornyl group, a tricyclodecanyl group or a tetracyclodecanyl group, and a branched alkylene group having a tertiary carbon atom bonded to the aliphatic cyclic group, can be used. Examples thereof include groups bonded to the oxygen atom of the carbonyloxy group (—C(O)—O—) in structural units represented by the general formulae (a1"-1) to (a1"-6) shown below.

[Chemical Formula 3]

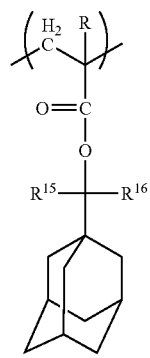

(a1"-1)

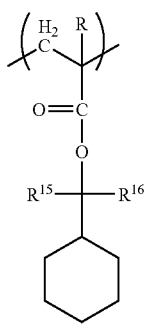

(a1″-2)

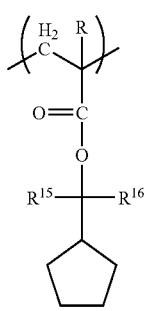

(a1″-3)

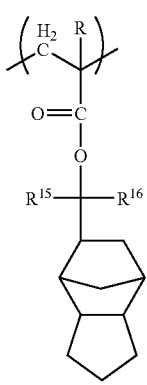

(a1″-4)

(a1″-5)

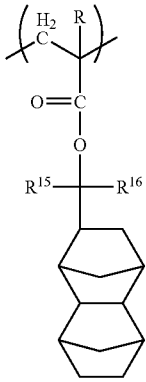

(a1″-6)

(In the formulae, R represents a hydrogen atom, a lower alkyl group or a halogenated lower alkyl group; and $R^{15}$ and $R^{16}$ each independently represents an alkyl group (which may be linear or branched, and is preferably an alkyl group of 1 to 5 carbon atoms).)

In the general formulae (a1″-1) to (a1″-6), the lower alkyl group or halogenated lower alkyl group for R are the same as those described above for $R^1$ in the above general formula (a0-1).

An "acetal-type acid dissociable, dissolution inhibiting group" generally replaces a hydrogen atom at the terminal of an alkali-soluble group such as a carboxy group and a hydroxyl group, so as to be bonded to an oxygen atom. When an acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of the acetal-type acid dissociable, dissolution inhibiting groups include groups represented by the general formula (p1) shown below.

[Chemical Formula 4]

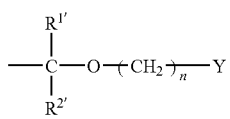

(p1)

(In the formula, $R^{1'}$ and $R^{2'}$ each independently represents a hydrogen atom or a lower alkyl group; n represents an integer of 0 to 3; and Y represents a lower alkyl group or an aliphatic cyclic group.)

In the above formula, n is preferably an integer of 0 to 2, more preferably 0 or 1, and most preferably 0.

In the above formula, $R^{1'}$ and $R^{2'}$ each independently represents a hydrogen atom or a lower alkyl group. As the lower alkyl group for $R^{1'}$ and $R^{2'}$, the same lower alkyl groups as those described above for $R^{1'}$ in the general formula (a0-1) can be used. As the lower alkyl group for $R^{1'}$ or $R^{2'}$, a methyl group or an ethyl group is preferable, and a methyl group is most preferable. In the present invention, at least one of $R^{1'}$ and $R^{2'}$ is preferably a hydrogen atom. That is, it is preferable that the acid dissociable, dissolution inhibiting group (p1) be a group represented by the general formula (p1-1) shown below.

[Chemical Formula 5]

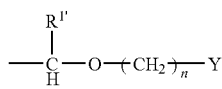

(p1-1)

(In the formula, $R^{1\prime}$, n, and Y are as defined above.)

As the lower alkyl group for Y, the same lower alkyl groups as those described above for $R^1$ in the above general formula (a0-1) can be used.

As the aliphatic cyclic group for Y, any of the monocyclic or polycyclic aliphatic cyclic groups which have been proposed for conventional ArF resists or the like can be used by being appropriately selected. For example, the same groups as those described above in the explanation of "aliphatic cyclic group" can be used.

Further, as the acetal-type, acid dissociable, dissolution inhibiting group, groups represented by general formula (p2) shown below can also be used.

[Chemical Formula 6]

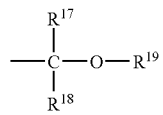

(p2)

(In the formula, $R^{17}$ and $R^{18}$ each independently represents a hydrogen atom, or a linear or branched alkyl group; $R^{19}$ represents a linear, branched or a cyclic alkyl group; alternately, $R^{17}$ and $R^{18}$ each may independently represent a linear or branched alkylene group, wherein the terminal of $R^{19}$ is bonded to the terminal of $R^{17}$ to form a ring.)

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly preferable that either one of $R^{17}$ and $R^{18}$ be a hydrogen atom, and the other be a methyl group.

$R^{19}$ represents a linear, branched or cyclic alkyl group. $R^{19}$ preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, a tricycloalkane or a tetracycloalkane, in which a fluorine atom or a fluorinated alkyl group may or may not be included as a substituent. More specific examples thereof include groups in which one or more hydrogen atoms have been removed from a monocycloalkane such as cyclopentane or cyclohexane, and a polycycloalkane such as adamantane, norbornane, isobornane, tricyclodecane, or tetracyclododecane. Of these, a group in which one or more hydrogen atoms have been removed from adamantane is preferable.

Also, in the general formula (p2), $R^{17}$ and $R^{19}$ each may independently represent a linear or branched alkylene group (and preferably an alkylene group of 1 to 5 carbon atoms), wherein the terminal of $R^{19}$ is bonded to the terminal of $R^{17}$.

In this case, a cyclic group is formed by $R^{17}$, $R^{19}$, the oxygen atom to which $R^{19}$ is bonded, and the carbon atom to which the oxygen atom and $R^{17}$ are bonded. Such a cyclic group is preferably a 4 to 7-membered ring, and more preferably a 4 to 6-membered ring. Specific examples of the cyclic group include a tetrahydropyranyl group and a tetrahydrofuranyl group.

As the structural unit (a1), it is preferable to use at least one kind selected from the group consisting of structural units represented by the general formula (a1-0-1) shown below and structural units represented by the general formula (a1-0-2) shown below.

[Chemical Formula 7]

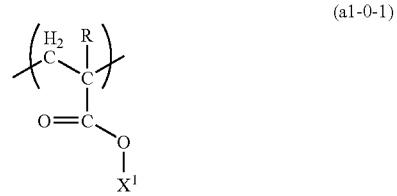

(a1-0-1)

(In the formula, R represents a hydrogen atom, a lower alkyl group or a halogenated lower alkyl group; and $X^1$ represents an acid dissociable, dissolution inhibiting group.)

[Chemical Formula 8]

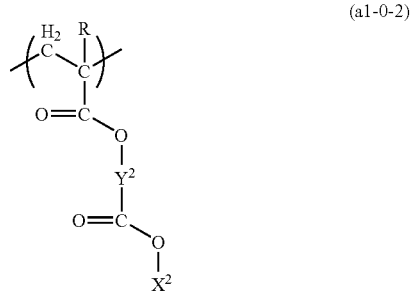

(a1-0-2)

(In the formula, R represents a hydrogen atom, a lower alkyl group or a halogenated lower alkyl group; $X^2$ represents an acid dissociable, dissolution inhibiting group; and $Y^2$ represents an alkylene group or an aliphatic cyclic group.)

In the general formula (a1-0-1), the lower alkyl group or halogenated lower alkyl group for R are the same as those described above for $R^1$ in the above general formula (a0-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and of these, tertiary alkyl ester-type acid dissociable, dissolution inhibiting groups are preferable.

In the general formula (a1-0-2), R is the same as $R^1$ described above in the general formula (a0-1).

$X^2$ is the same as $X^1$ described above in the general formula (a1-0-1).

$Y^2$ is preferably an alkylene group of 1 to 4 carbon atoms, or a bivalent aliphatic cyclic group. As the aliphatic cyclic group, the same groups as those described above in the explanation of "aliphatic cyclic group" can be used, exclusive of the difference that the aliphatic cyclic group used for $Y^2$ is an aliphatic cyclic groups in which two or more hydrogen atoms have been removed.

Specific examples of the structural unit (a1) include structural units represented by the general formulae (a1-1) to (a1-4) shown below.

[Chemical Formula 9]

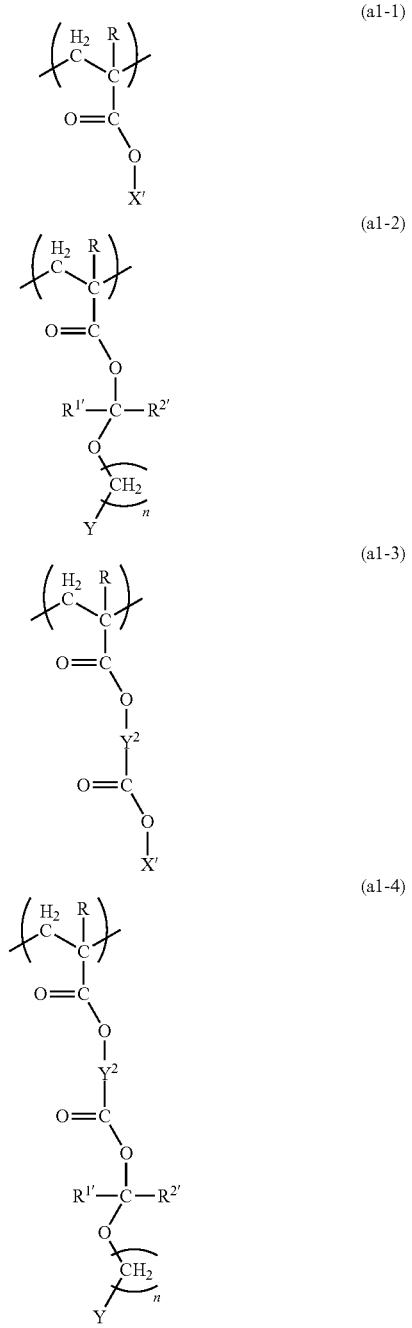

(In the above formulae, X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or a bivalent aliphatic cyclic group; R is the same as $R^1$ in the above general formula (a0-1); $R^{1\prime}$ and $R^{2\prime}$ each independently represents a hydrogen atom or a lower alkyl group of 1 to 5 carbon atoms.)

It is preferable that at least one of $R^{1\prime}$ and $R^{2\prime}$ represent a hydrogen atom, and it is more preferable that both of $R^{1\prime}$ and $R^{2\prime}$ represent hydrogen atoms. n is preferably 0 or 1.

The tertiary alkyl ester-type acid dissociable, dissolution inhibiting group for X' is the same tertiary alkyl ester-type acid dissociable, dissolution inhibiting groups as those described above for $X^1$.

Examples of the aliphatic cyclic group for Y include the same groups as those described above in the explanation of "aliphatic cyclic group".

$Y^2$ is preferably an alkylene group of 1 to 10 carbon atoms, or a bivalent aliphatic cyclic group. As the aliphatic cyclic group, the same groups as those described above in the explanation of "aliphatic cyclic group" can be used, exclusive of the difference that the aliphatic cyclic group used for $Y^2$ is an aliphatic cyclic groups in which two or more hydrogen atoms have been removed. When $Y^2$ represents an alkylene group of 1 to 10 carbon atoms, it is more preferable that the alkylene group for $Y^2$ have 1 to 6 carbon atoms, still more preferably 1 to 4 carbon atoms, and most preferably 1 to 3 carbon atoms. When $Y^2$ represents a bivalent aliphatic cyclic group, it is particularly preferable that the bivalent aliphatic cyclic group be a group in which two or more hydrogen atoms have been removed from a cyclopentane, a cyclohexane, a norbornane, an isobornane, an adamantane, a tricyclodecane or a tetracyclododecane.

Specific examples of structural units represented by the general formulae (a1-1) to (a1-4) shown above include the following.

[Chemical Formula 10]

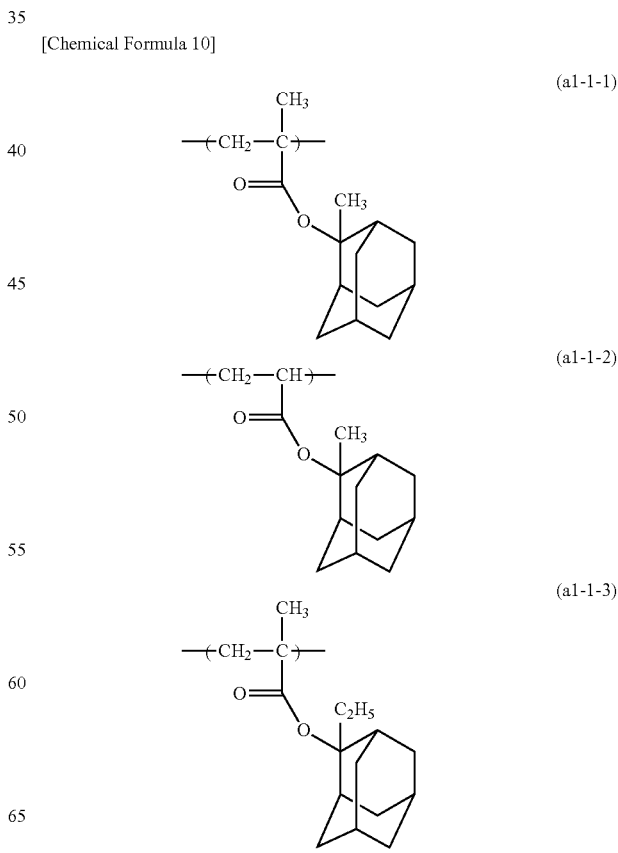

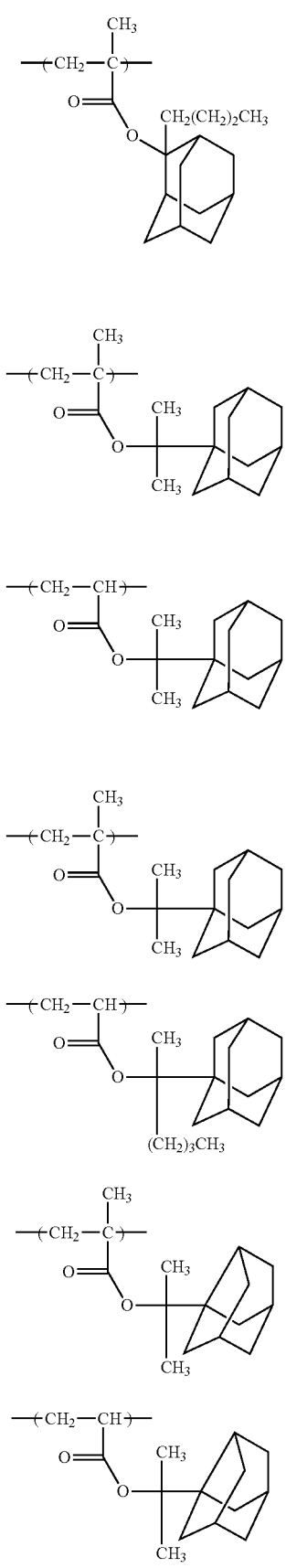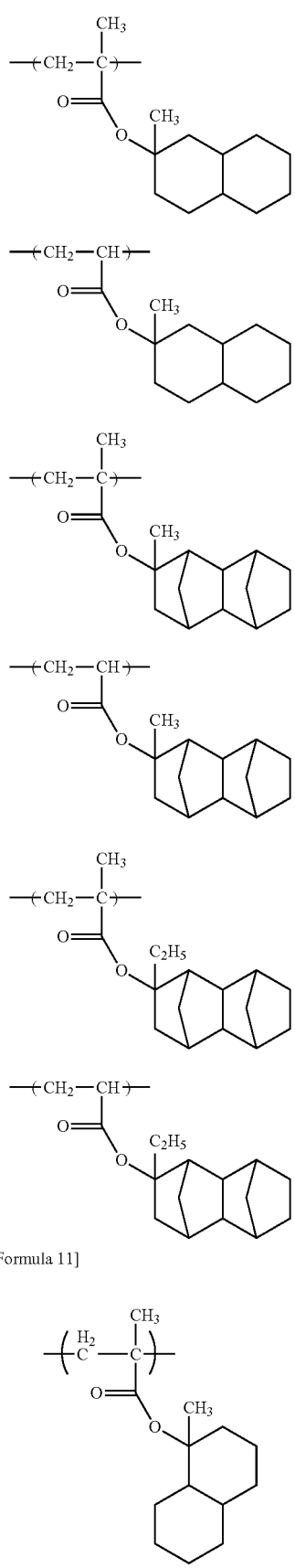

(a1-1-18) 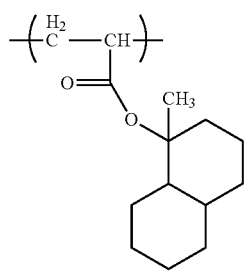
(a1-1-19) 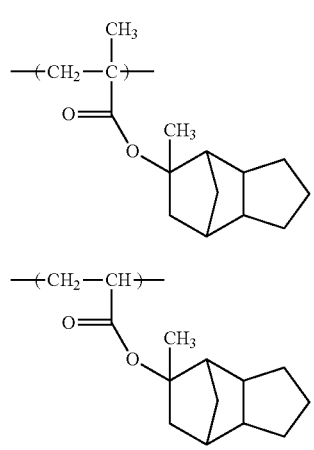
(a1-1-20) 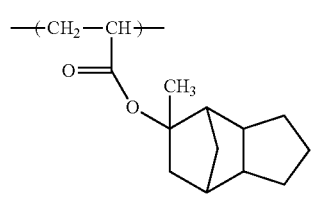
(a1-1-21) 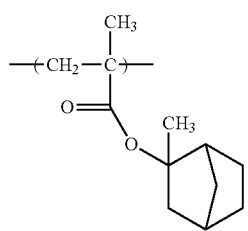
(a1-1-22) 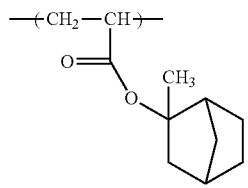
(a1-1-23) 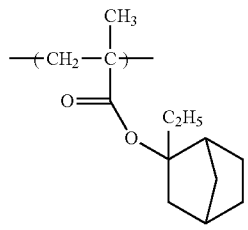
(a1-1-24) 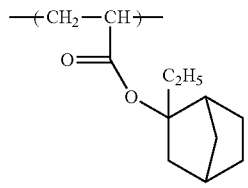
(a1-1-25) 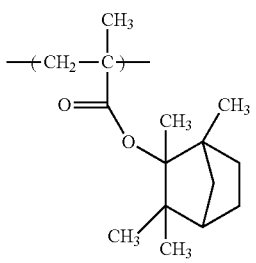
(a1-1-26) 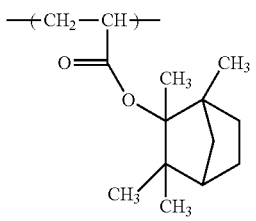
(a1-1-27) 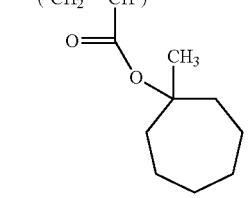
(a1-1-28) 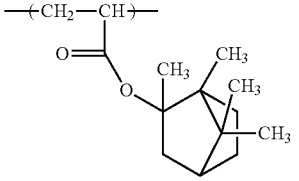
(a1-1-29) 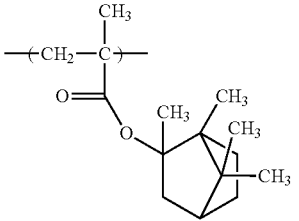
(a1-1-30) 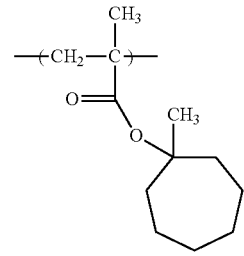
(a1-1-31) 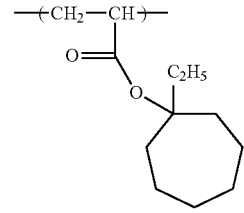

(a1-1-32) 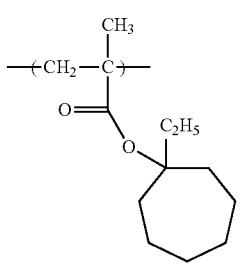
[Chemical Formula 12]
(a1-1-33) 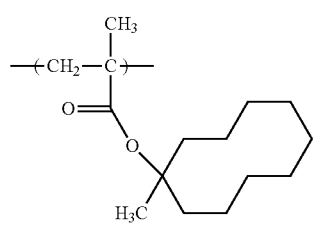
(a1-1-34) 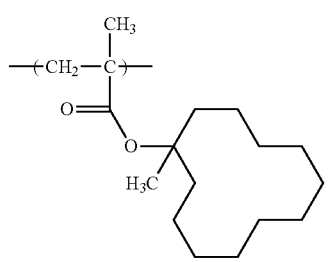
(a1-1-35) 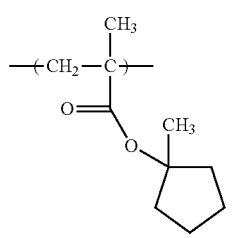
(a1-1-36) 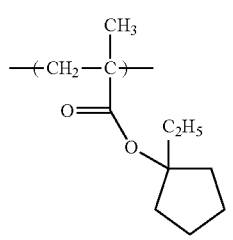
(a1-1-37) 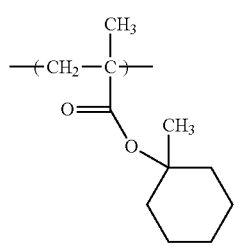
(a1-1-38) 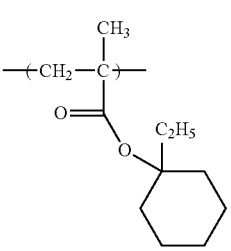
(a1-1-39) 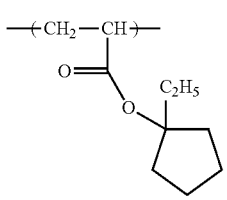
(a1-1-40) 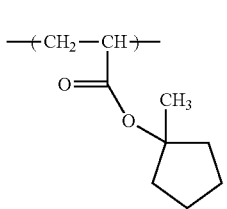
(a1-1-41) 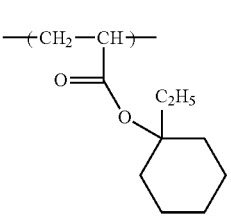
(a1-1-42) 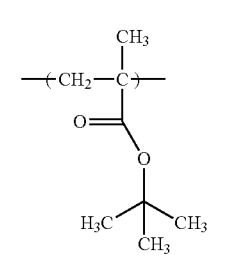
(a1-1-43) 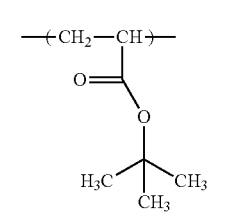
(a1-1-44) 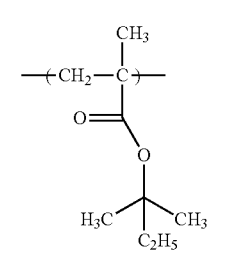

(a1-1-45)
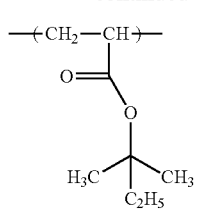
[Chemical Formula 13]
(a1-2-1)
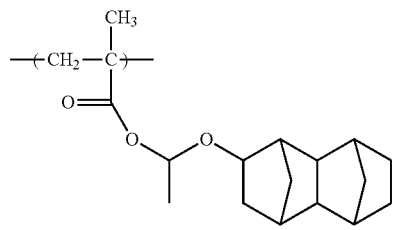
(a1-2-2)
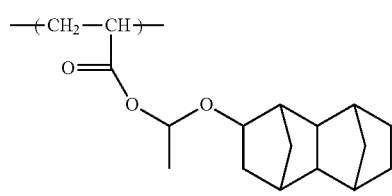
(a1-2-3)
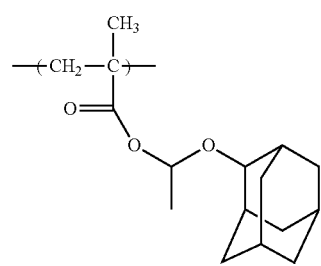
(a1-2-4)
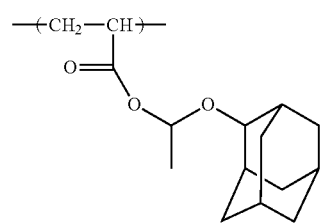
(a1-2-5)
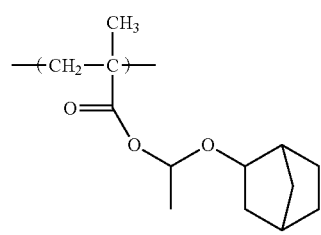
(a1-2-6)
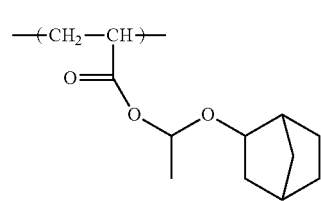
[Chemical Formula 14]
(a1-2-7)
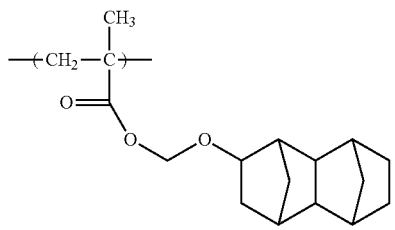
(a1-2-8)
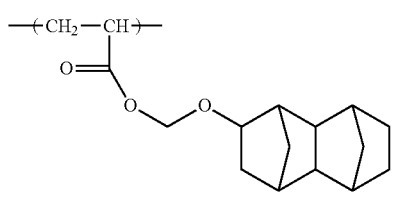
(a1-2-9)
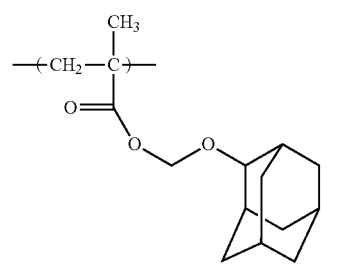
(a1-2-10)
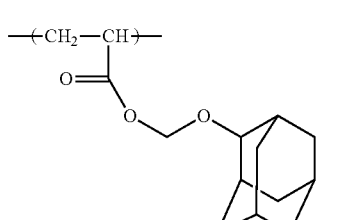
(a1-2-11)
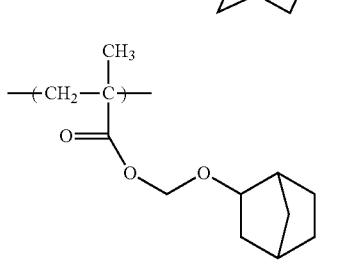
(a1-2-12)
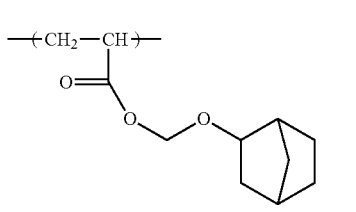
(a1-2-13)
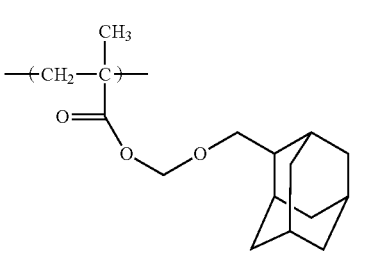

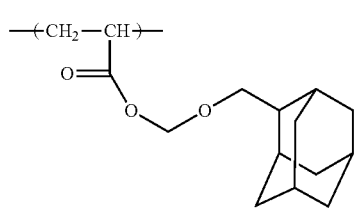 (a1-2-14)
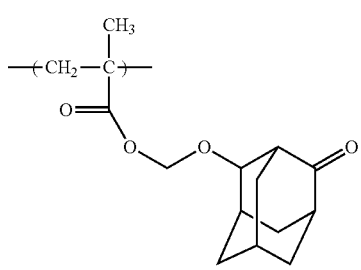 (a1-2-15)
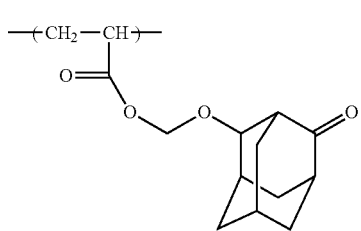 (a1-2-16)
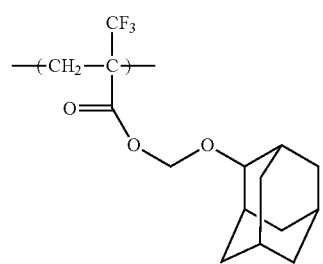 (a1-2-17)
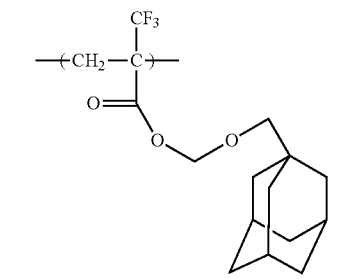 (a1-2-18)
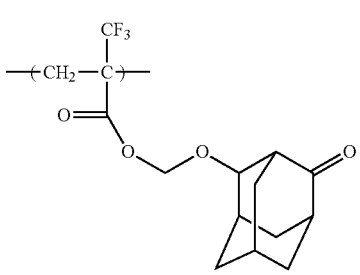 (a1-2-19)
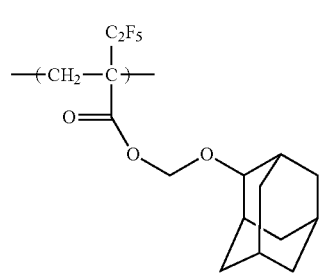 (a1-2-20)
[Chemical Formula 15]
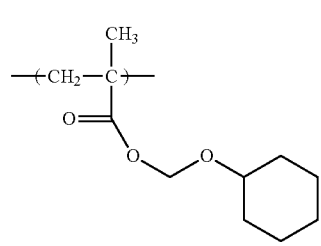 (a1-2-21)
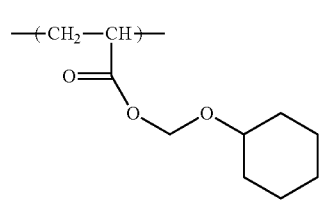 (a1-2-22)
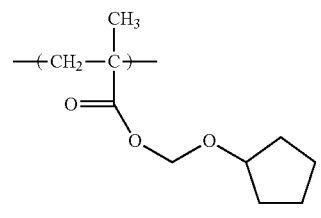 (a1-2-23)
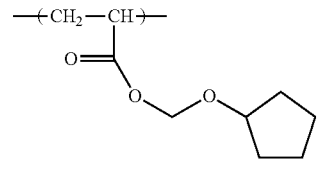 (a1-2-24)
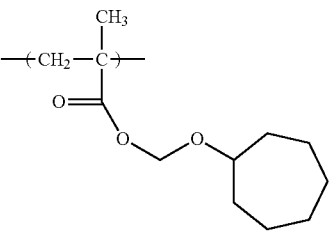 (a1-2-25)
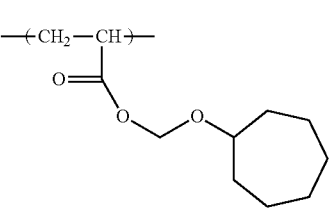 (a1-2-26)

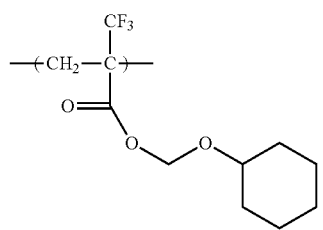 (a1-2-27)
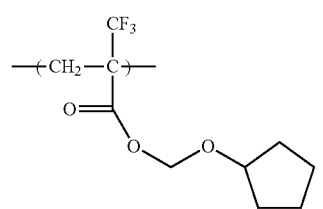 (a1-2-28)
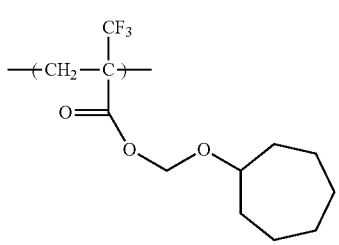 (a1-2-29)
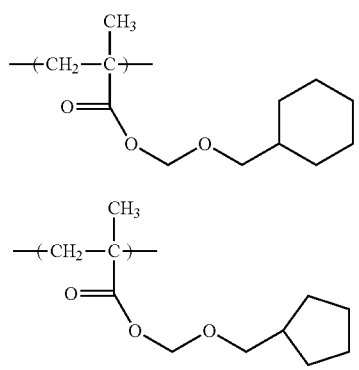 (a1-2-30)
(a1-2-31)
[Chemical Formula 16]
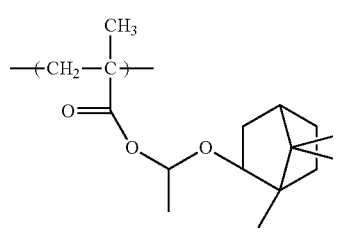 (a1-2-32)
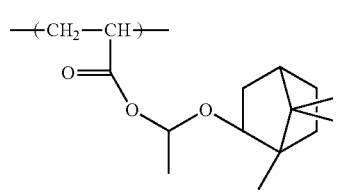 (a1-2-33)
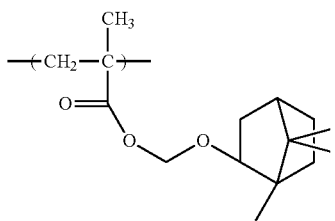 (a1-2-34)
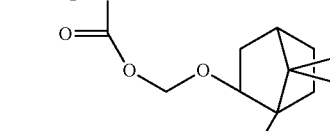 (a1-2-35)
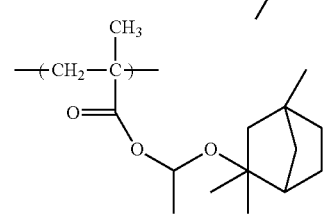 (a1-2-36)
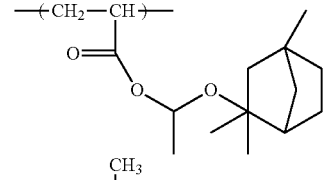 (a1-2-37)
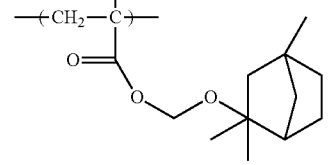 (a1-2-38)
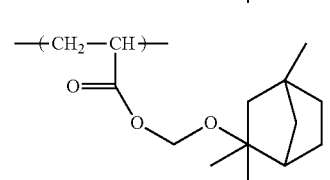 (a1-2-39)
[Chemical Formula 17]
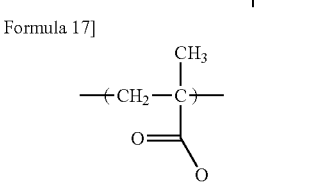 (a1-3-1)

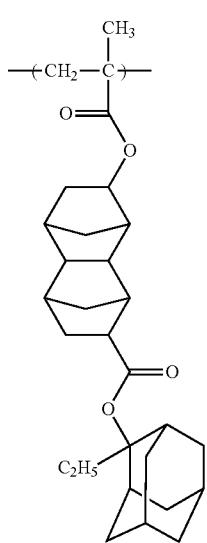 (a1-3-2)
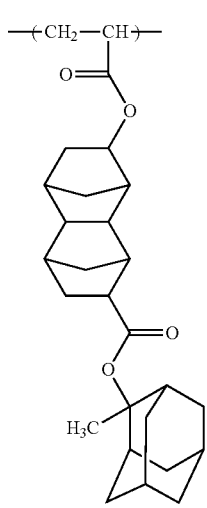 (a1-3-3)
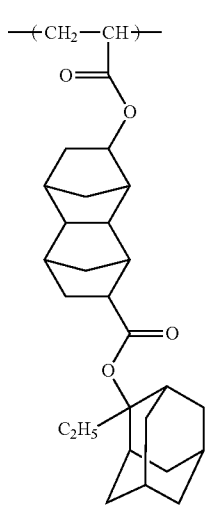 (a1-3-4)
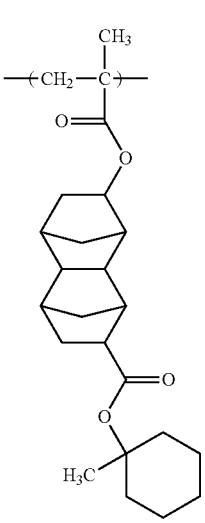 (a1-3-5)
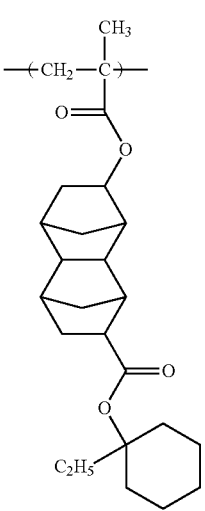 (a1-3-6)
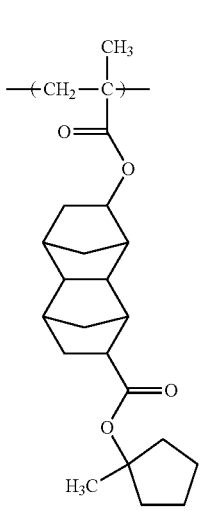 (a1-3-7)

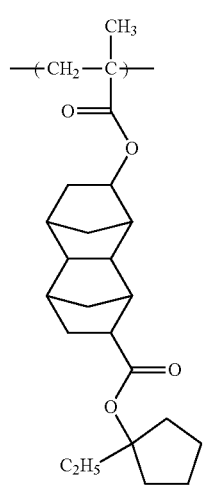
(a1-3-8)
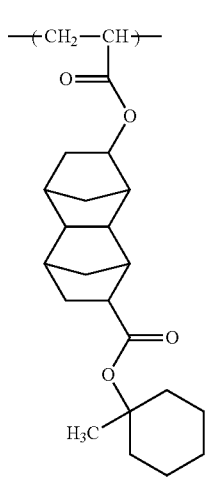
(a1-3-9)
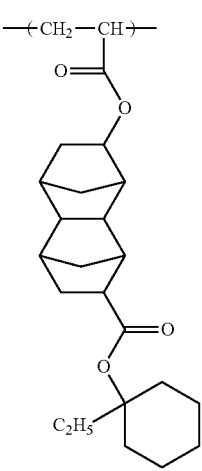
(a1-3-10)
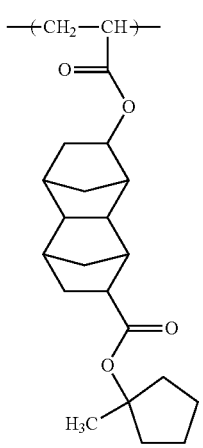
(a1-3-11)
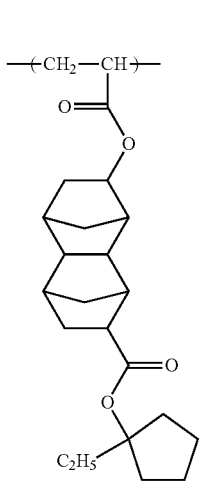
(a1-3-12)
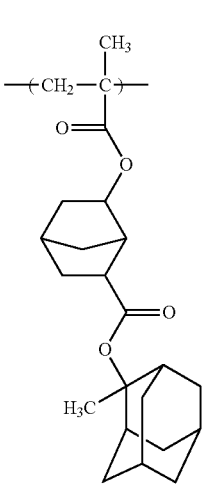
(a1-3-13)

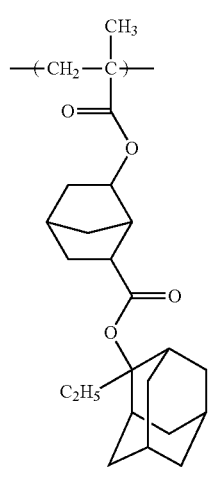 (a1-3-14)
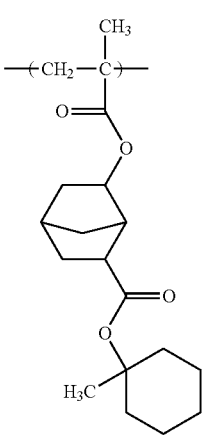 (a1-3-17)
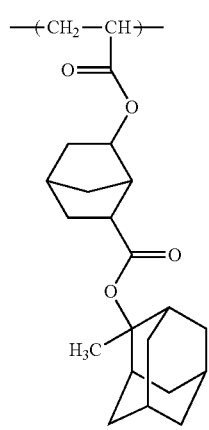 (a1-3-15)
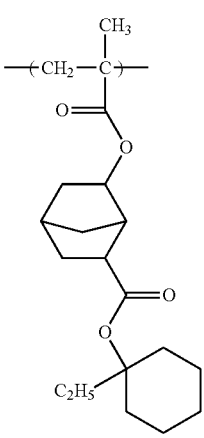 (a1-3-18)
[Chemical Formula 18]
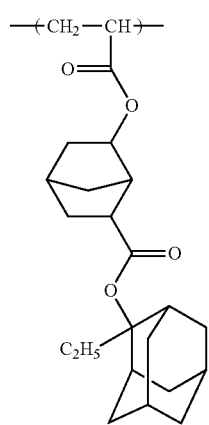 (a1-3-16)
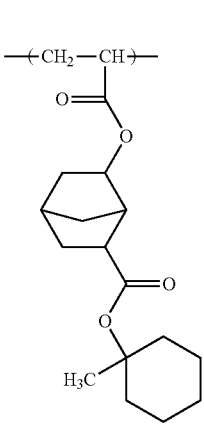 (a1-3-19)

-continued
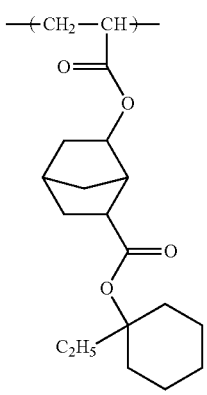
(a1-3-20)
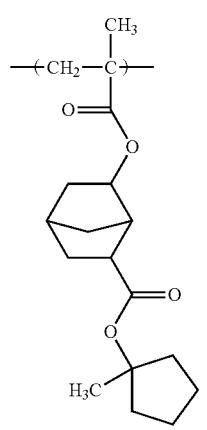
(a1-3-21)
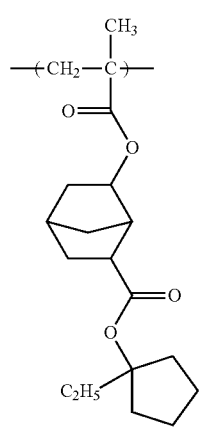
(a1-3-22)
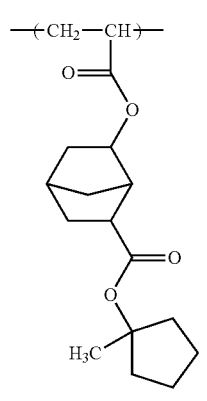
(a1-3-23)
-continued
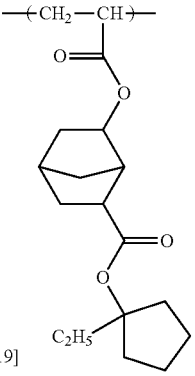
(a1-3-24)
[Chemical Formula 19]
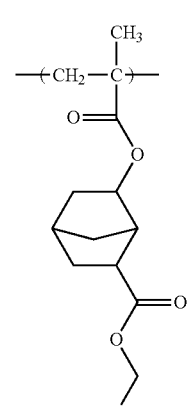
(a1-4-1)
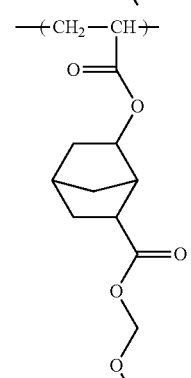
(a1-4-2)
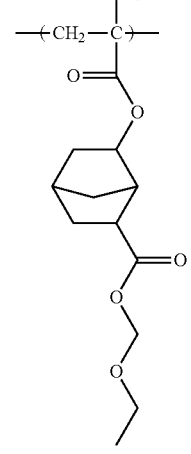
(a1-4-3)

(a1-4-4)
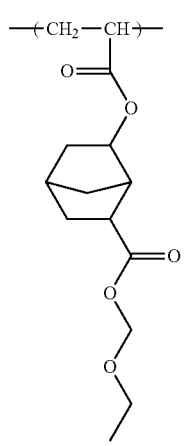
(a1-4-5)
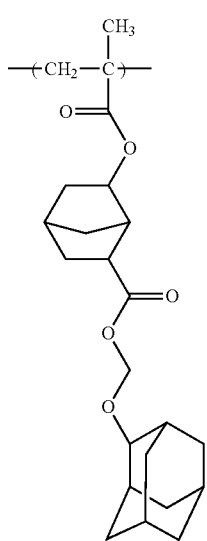
(a1-4-6)
(a1-4-7)
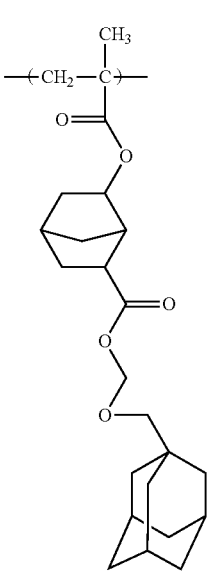
(a1-4-8)
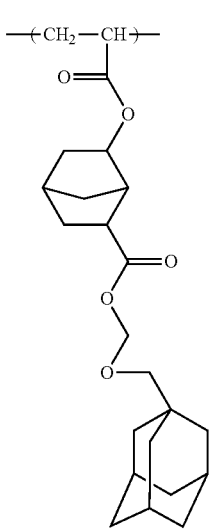
(a1-4-9)
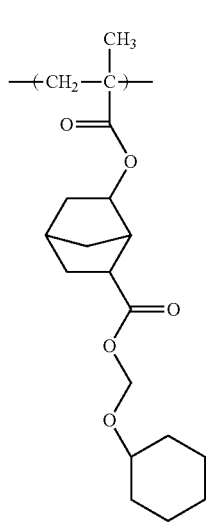

-continued
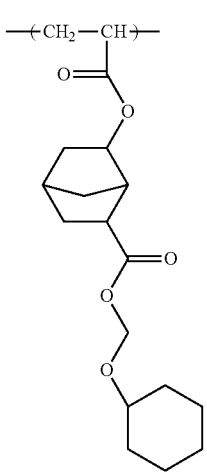 (a1-4-10)
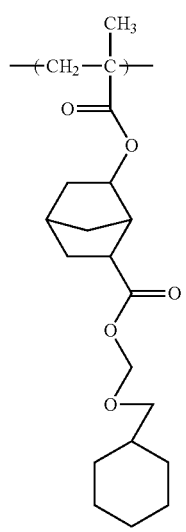 (a1-4-11)
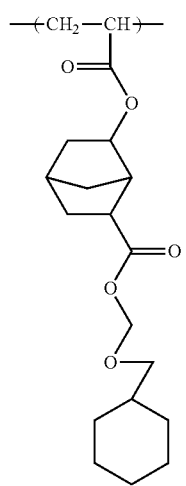 (a1-4-12)
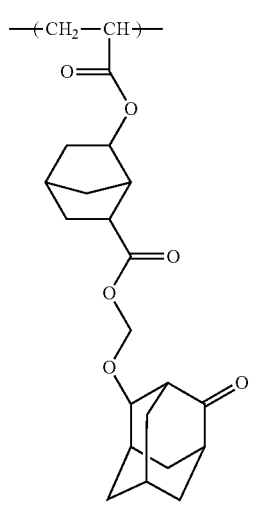 (a1-4-13)
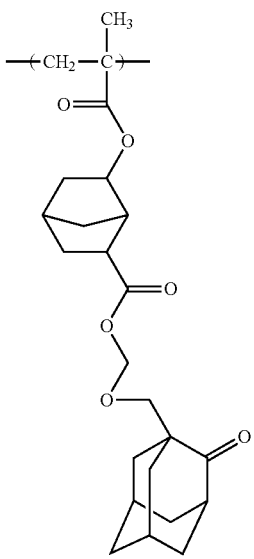 (a1-4-14)
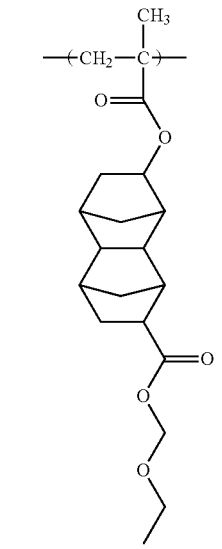 (a1-4-15)

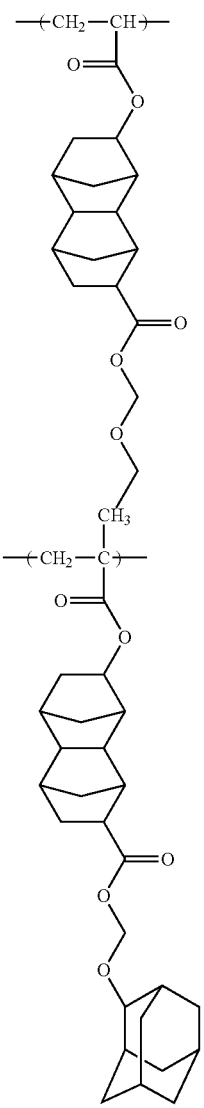
(a1-4-16)
(a1-4-17)
[Chemical Formula 20]
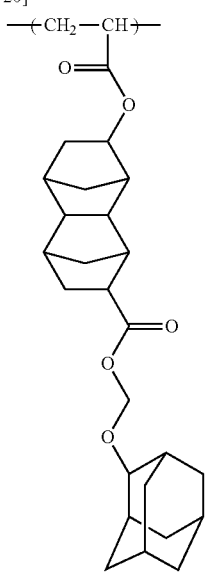
(a1-4-18)
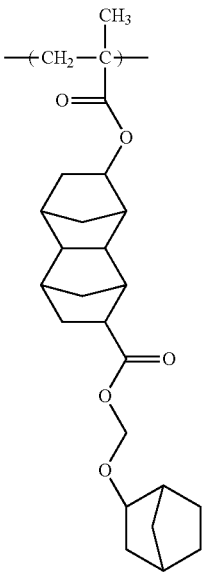
(a1-4-19)
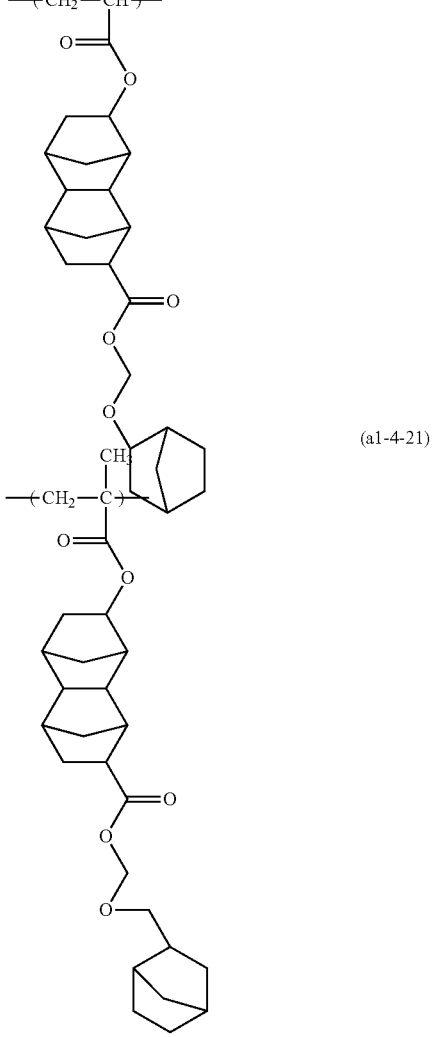
(a1-4-20)
(a1-4-21)

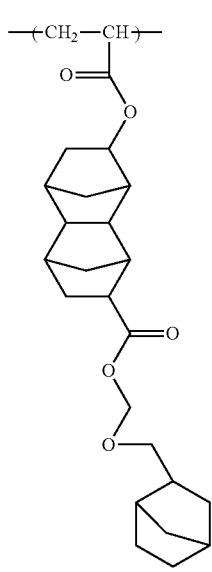 (a1-4-22)
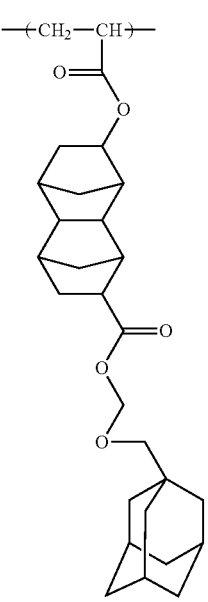 (a1-4-24)
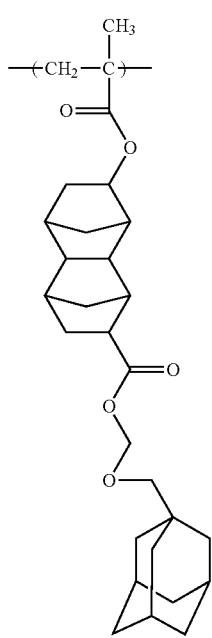 (a1-4-23)
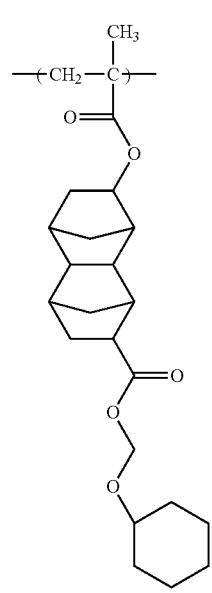 (a1-4-25)

(a1-4-26)
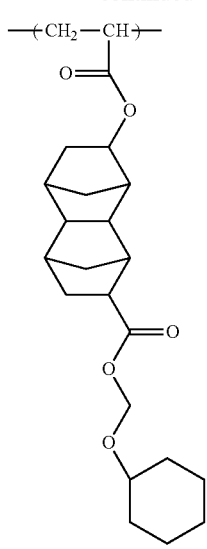
(a1-4-27)
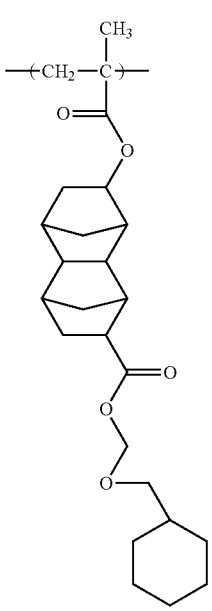
(a1-4-28)
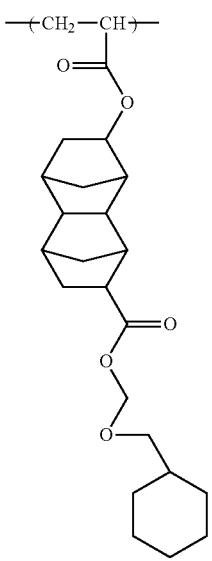
(a1-4-29)
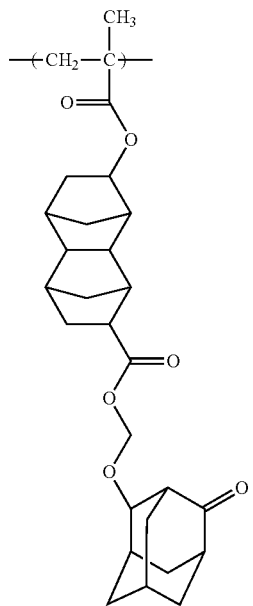
(a1-4-30)
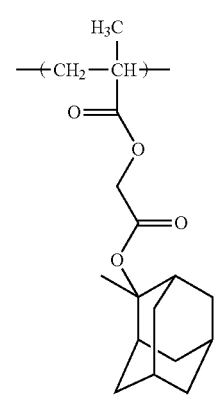
(a1-4-31)

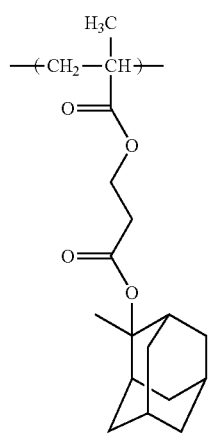
(a1-4-32)
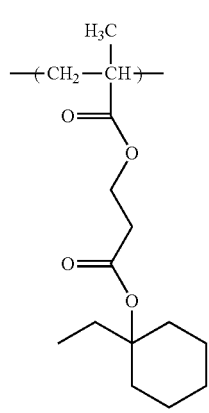
(a1-4-33)
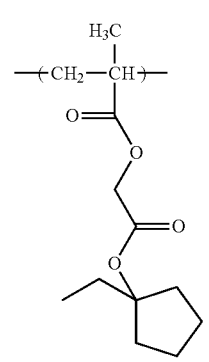
(a1-4-34)
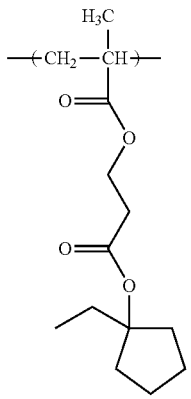
(a1-4-35)
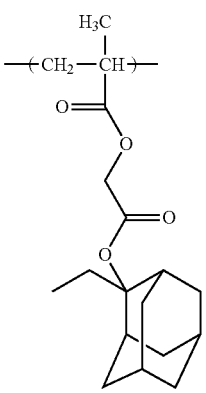
(a1-4-36)
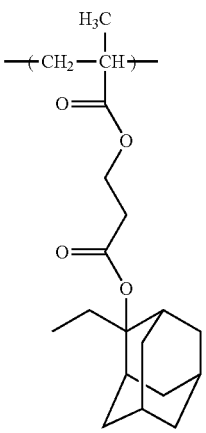
(a1-4-37)
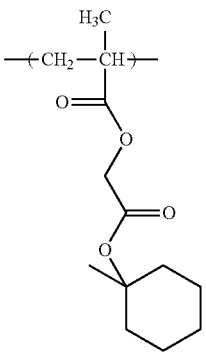
(a1-4-38)
(a1-4-39)

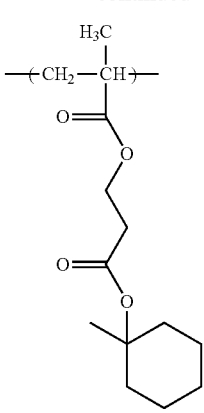

(a1-4-40)

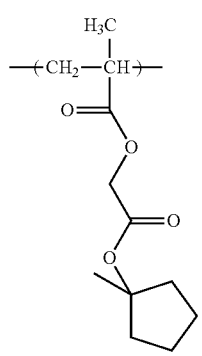

(a1-4-41)

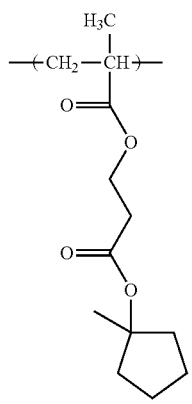

(a1-4-42)

Of these, a structural unit represented by the general formula (a1-1) is preferable. Specifically, it is more preferable to use at least one selected from the group consisting of the general formulae (a1-1-1) to (a1-1-6), and (a1-1-35) to (a1-1-41).

Further, as the structural unit (a1), structural units represented by the general formula (a1-1-01) shown below which includes the structural units represented by formulae (a1-1-1) to (a1-1-4), and structural units represented by the general formula (a1-1-02) shown below which includes the structural units represented by formulae (a1-1-35) to (a1-1-41) are also preferable.

[Chemical Formula 21]

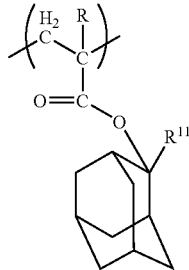

(a1-1-01)

(In the formula, R represents a hydrogen atom, a lower alkyl group, or a halogenated lower alkyl group; and $R^{11}$ represents a lower alkyl group.)

[Chemical Formula 22]

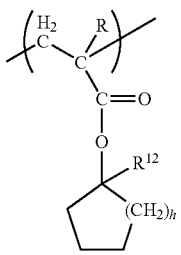

(a1-1-02)

(In the formula, R represents a hydrogen atom, a lower alkyl group, or a halogenated lower alkyl group; $R^{12}$ represents a lower alkyl group; and h represents an integer of 1 to 3.)

In the general formula (a1-1-01), R is the same as $R^1$ described in the aforementioned general formula (a0-1). The lower alkyl group for $R^{11}$ is the same as the lower alkyl group described above for $R^1$, and is preferably a methyl group or an ethyl group.

In the general formula (a1-1-02), R is the same as $R^1$ described in the aforementioned general formula (a0-1). The lower alkyl group for $R^{12}$ is the same as the lower alkyl group described above for $R^1$ It is preferably a methyl group or an ethyl group, and most preferably an ethyl group. h is preferably 1 or 2, and most preferably 2.

In the polymeric compound (A1), as the structural unit (a1), one type can be used alone, or two or more types can be used in combination.

With respect to the proportion of the structural unit (a1) in the polymeric compound (A1), the total proportion of the structural units (a0) and (a1) is preferably 10 to 80 mol %, more preferably 20 to 70 mol %, and most preferably 25 to 50 mol %, based on the combined total of all the structural units that constitute the polymer compound (A1). When this proportion is not less than the lower limit in the above range, then a pattern can be easily formed using a resist composition which includes the structural unit (a1), whereas when the proportion is not more than the upper limit in the above range, a good quantitative balance with the other structural units can be attained.

If both of the structural unit (a0) and the structural unit (a1) are used together, it is preferable to use the structural units (a0) and (a1) within the range of "structural unit (a0): structural unit (a1)=1:9 to 9:1 (molar ratio)", more preferably 1:9 to 7:3, still more preferably 1:9 to 5:5, and most preferably 1:9 to 4:6. When the structural units (a0) and (a1) are used within the above range, lithography properties such as LWR can be improved.

<Structural Unit (a2)>

Structural unit (a2) is a structural unit derived from an acrylate ester which has a lactone-containing cyclic group.

Here, the term "lactone-containing cyclic group" means a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

When the positive resist composition which includes the polymeric compound (A1) is used to form a resist film, the lactone-containing cyclic group of the structural unit (a2) is effective at improving the adhesion between the resist film and a substrate, and improving compatibility with the aqueous developing solution.

The structural unit (a2) can be used arbitrarily without any particular restriction.

Specific examples of the lactone-containing monocyclic group include a group in which one hydrogen atom is eliminated from γ-butyrolactone. Furthermore, specific examples of the lactone-containing polycyclic group include groups in which one hydrogen atom has been eliminated from a bicycloalkane, a tricycloalkane, or a tetracycloalkane which contains a lactone ring.

Specific examples of the structural unit (a2) include structural units represented by the general formulae (a2-1) to (a2-5) shown below.

[Chemical Formula 23]

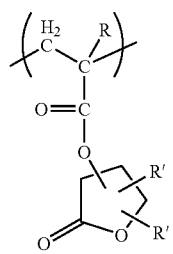
(a2-1)

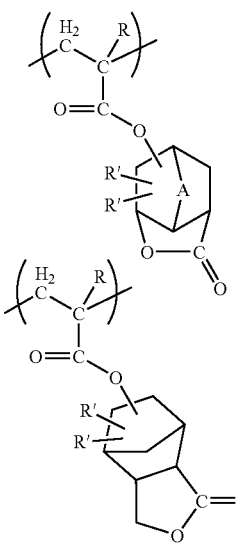
(a2-2)

(a2-3)

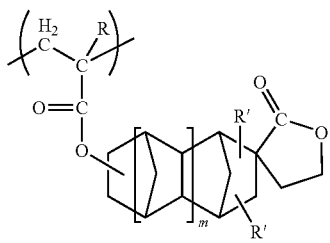
(a2-4)

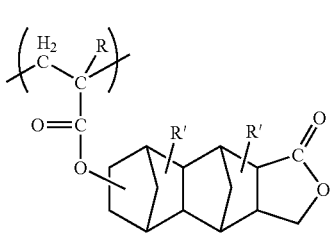
(a2-5)

(In the formulae, R represents a hydrogen atom, a lower alkyl group or a halogenated lower alkyl group; R' represents a hydrogen atom, a lower alkyl group or an alkoxy group of 1 to 5 carbon atoms; m represents an integer of 0 or 1; and A represents an alkylene group of 1 to 5 carbon atoms or an oxygen atom.)

In the formulae (a2-1) to (a2-5), R is the same as $R^1$ in the above general formula (a0-1).

The lower alkyl group for R' is the same as the lower alkyl group for $R^1$ in the above general formula (a0-1).

Specific examples of the alkylene group of 1 to 5 carbon atoms for A include a methylene group, an ethylene group, an n-propylene group and an isopropylene group.

In the general formulae (a2-1) to (a2-5), R' is preferably a hydrogen atom in terms of industrial availability.

Specific examples of the structural unit represented by the general formulae (a2-1) to (a2-5) include the following.

[Chemical Formula 24]

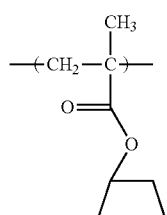
(a2-1-1)

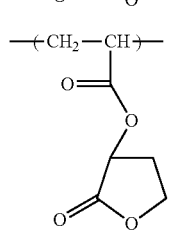
(a2-1-2)

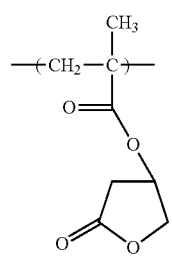 (a2-1-3)
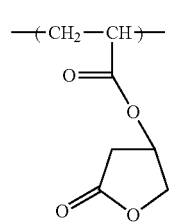 (a2-1-4)
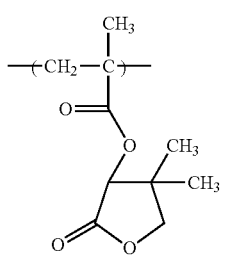 (a2-1-5)
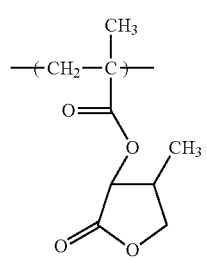 (a2-1-6)
[Chemical Formula 25]
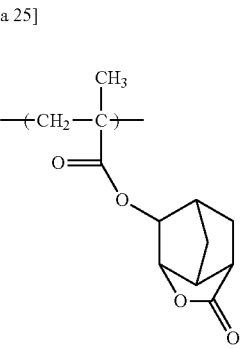 (a2-2-1)
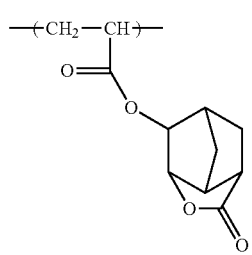 (a2-2-2)
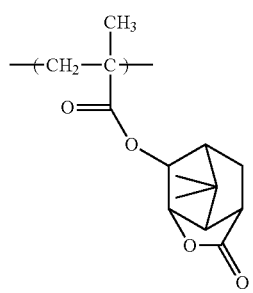 (a2-2-3)
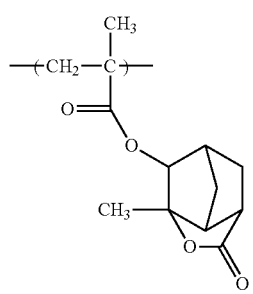 (a2-2-4)
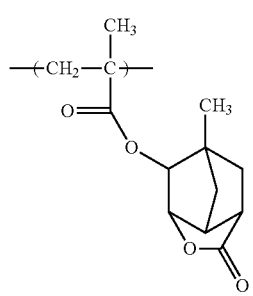 (a2-2-5)
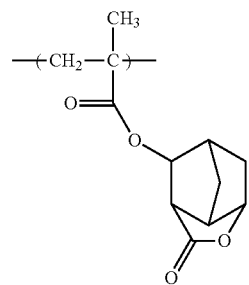 (a2-2-6)
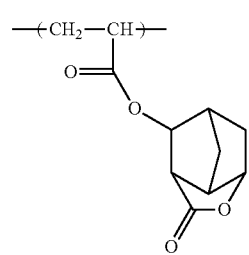 (a2-2-7)

(a2-2-8) 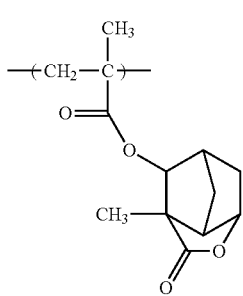
(a2-2-9) 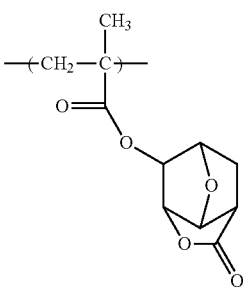
(a2-2-10) 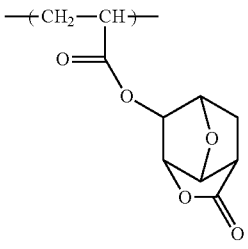
[Chemical Formula 26]
(a2-3-1) 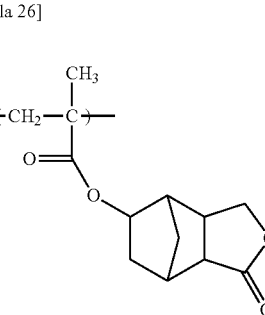
(a2-3-2) 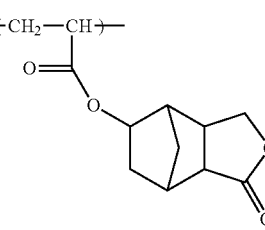
(a2-3-3) 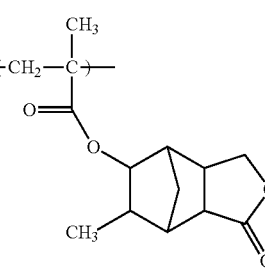
(a2-3-4) 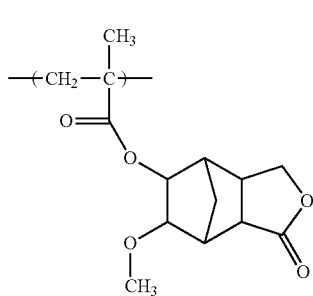
(a2-3-5) 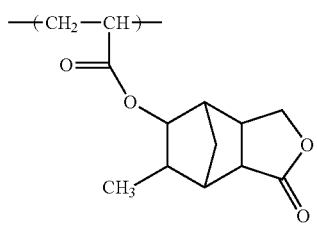
(a2-3-6) 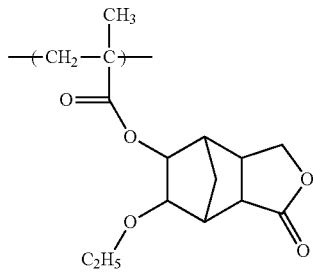
(a2-3-7) 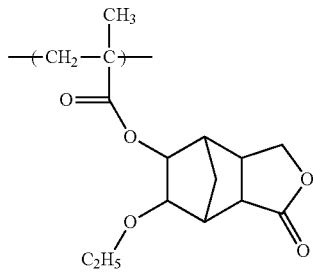
(a2-3-8) 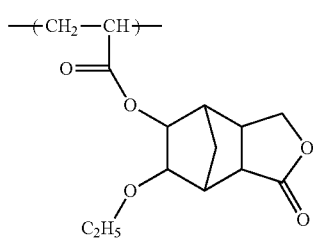
(a2-3-9) 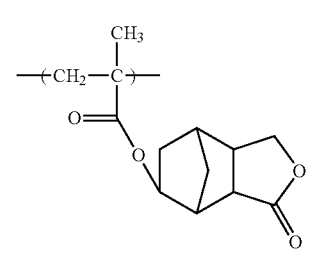

(a2-3-10)
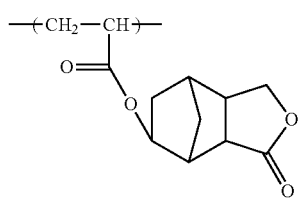
[Chemical Formula 27]
(a2-4-1)
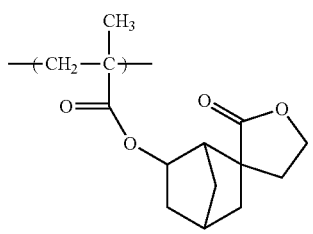
(a2-4-2)
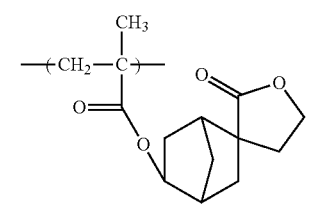
(a2-4-3)
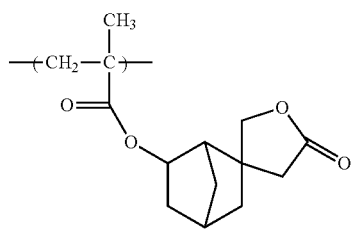
(a2-4-4)
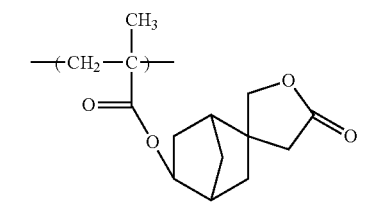
(a2-4-5)
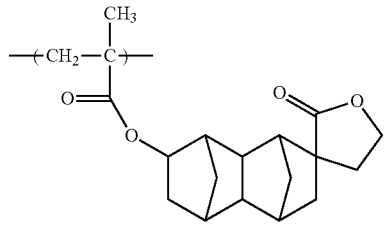
(a2-4-6)
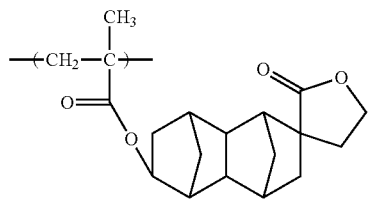
(a2-4-7)
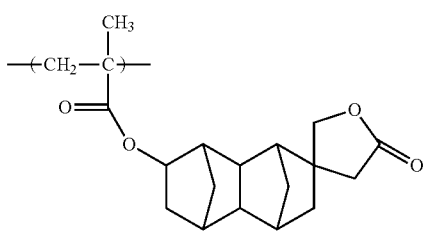
(a2-4-8)
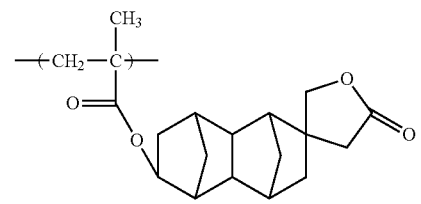
(a2-4-9)
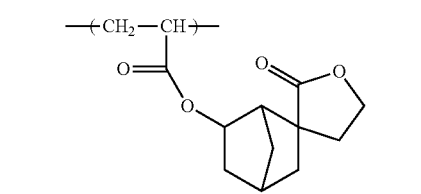
(a2-4-10)
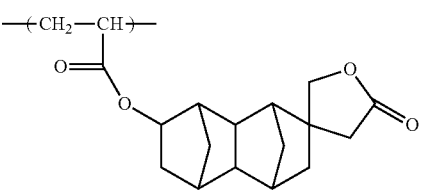
(a2-4-11)
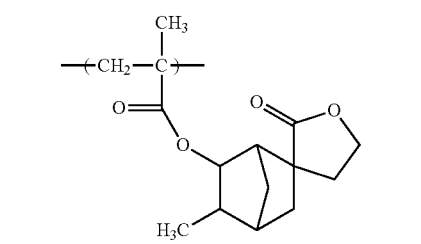
(a2-4-12)
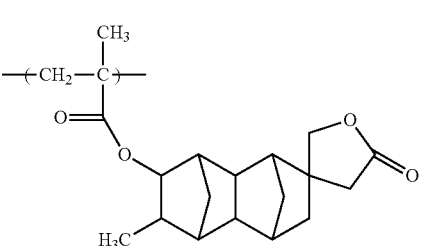
[Chemical Formula 28]
(a2-5-1)
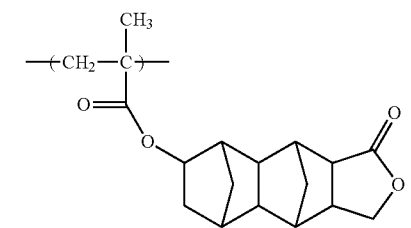

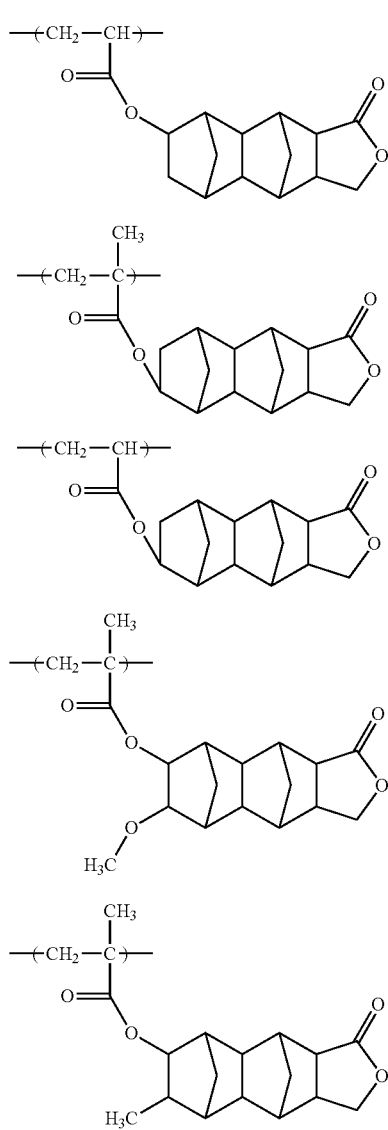

In the polymeric compound (A1), as the structural unit (a2), one type can be used alone, or two or more types can be used in combination.

The structural unit (a2) is preferably at least one kind selected from the group consisting of the structural units represented by the general formulae (a2-1) to (a2-5), and more preferably at least one kind selected from the group consisting of the structural units represented by the general formulae (a2-1) to (a2-3). Of these, at least one kind selected from the group consisting of the structural units represented by the formulae (a2-1-1), (a2-1-2), (a2-2-1), (a2-2-2), (a2-3-1), (a2-3-2), (a2-3-9) and (a2-3-10) is particularly preferable.

In the polymeric compound (A1), as the structural unit (a2), one type can be used alone, or two or more types can be used in combination.

The proportion of the structural unit (a2) in the polymeric compound (A1) is preferably from 5 to 60 mol %, more preferably from 10 to 60 mol %, and still more preferably from 20 to 60 mol %, based on the combined total of all the structural units that constitute the polymeric compound (A1).

When this proportion is not less than the lower limit in the above range, then the effect made by containing the structural unit (a2) can be sufficiently obtained. When the proportion is not more than the upper limit in the above range, a good quantitative balance with the other structural units can be attained.

<Structural Unit (a3)>

Structural unit (a3) is a structural unit derived from an acrylate ester which has a polar group-containing aliphatic hydrocarbon group.

When the component (A1) includes the structural unit (a3), the hydrophilicity of the component (A1) is improved, and hence, the compatibility of the component (A1) with the developing solution is improved. As a result, when the polymeric compound (A1) is included in the positive resist composition, the solubility of the exposed portions of the resist film formed by using the positive resist composition in the alkali developing solution can be improved, which contributes to favorable improvements in the resolution.

Examples of the polar group include a hydroxyl group, a cyano group, a carboxyl group, and a hydroxyalkyl group in which a part of the hydrogen atoms in an alkyl group is substituted with fluorine atoms. Of these, a hydroxyl group is particularly preferable.

Examples of the aliphatic hydrocarbon group include a linear or branched hydrocarbon group (preferably an alkylene group) of 1 to 10 carbon atoms, and a polycyclic aliphatic hydrocarbon group (polycyclic group). The polycyclic group can appropriately be selected from the multitude of groups proposed in resins used in resist compositions for ArF excimer lasers and the like. The polycyclic group preferably has 7 to 30 carbon atoms.

Of these, a structural unit derived from an acrylate ester having the polycyclic aliphatic group which contains a hydroxyl group, cyano group, a carboxyl group, or a hydroxyalkyl group in which a part of the hydrogen atoms within the alkyl group has been substituted with fluorine atoms is more preferable. Examples of the polycyclic group include groups in which two or more hydrogen atoms have been removed from a bicycloalkane, a tricycloalkane, a tetracycloalkane or the like. Specific examples include a group in which two or more hydrogen atoms have been removed from a polycycloalkane such as adamantane, norbornane, isobornane, tricyclodecane, or tetracyclododecane. Of these polycyclic groups, a group in which two or more hydrogen atoms have been removed from adamantane, norbornane, or tetracyclododecane is industrially preferable.

As the structural unit (a3), for example, a structural unit derived from a hydroxyethyl ester of acrylic acid is preferable, when the hydrocarbon group within the polar group-containing aliphatic hydrocarbon group is a linear or branched hydrocarbon group of 1 to 10 carbon atoms. On the other hand, a structural unit represented by the general formula (a3-1), (a3-2), or (a3-3) shown below is preferable, when the hydrocarbon group is a polycyclic group.

[Chemical Formula 29]

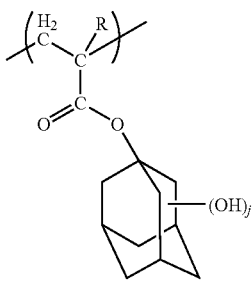

(a3-1)

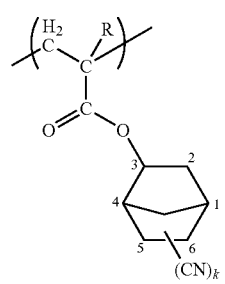

(a3-2)

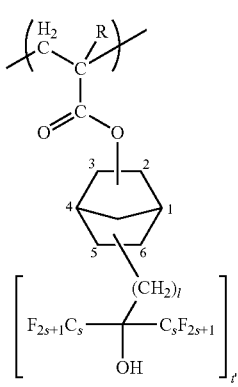

(a3-3)

(In the formulae, R is the same as $R^1$ in the above general formula (a0-1); j represents an integer of 1 to 3; k represents an integer of 1 to 3; t' represents an integer of 1 to 3; l represents an integer of 1 to 5; and s represents an integer of 1 to 3.)

In the general formula (a3-1), j is preferably 1 or 2, and more preferably 1. In the case that j be 2, a structural unit in which the hydroxyl groups are bonded to the 3-position and 5-position of the adamantyl group is preferable. In the case that j be 1, a structural unit in which the hydroxyl group is bonded to the 3-position of the adamantyl group is preferable.

Of these, j is preferably 1, and a structural unit in which the hydroxyl group is bonded to the 3-position of adamantyl group is particularly preferable.

In the general formula (a3-2), k is preferably 1.

In the general formula (a3-2), a cyano group is preferably bonded to the 5-position or 6-position of the norbornyl group.

In the general formula (a3-3), t' is preferably 1. l is preferably 1. s is preferably 1.

Further, in the general formula (a3-3), it is preferable that a 2-norbonyl group or 3-norbonyl group be bonded to the terminal of the carboxyl group of the acrylic acid.

It is preferable that a fluorinated alkyl alcohol within brackets [ ] in the formula (a3-3) be bonded to the 5-position or 6-position of the norbornyl group.

In the polymeric compound (A1), as the structural unit (a3), one type can be used alone, or two or more types can be used in combination.

In the polymeric compound (A1), the proportion of the structural unit (a3) is preferably 5 to 50 mol %, more preferably 5 to 40 mol %, and still more preferably 5 to 25 mol %, based on the combined total of all the structural units that constitute the polymeric compound (A1).

<Structural Unit (a4)>

The polymeric compound (A1) may also include a structural unit (a4) other than the structural units (a0) to (a3), within the range that the effect of the present invention is not impaired.

As the structural unit (a4), any other structural unit which cannot be classified as the above structural units (a1) to (a3) can be used without any particular limitations, and any of the multitude of conventional structural units used within resist resins for ArF excimer lasers or KrF excimer lasers (and particularly for ArF excimer lasers) can be used.

The structural unit (a4) is preferably, for example, a structural unit derived from an acrylate ester containing a non-acid-dissociable aliphatic polycyclic group. Examples of the polycyclic group include the same groups as those described above in the structural unit (a1), and any of the multitude of conventional polycyclic groups used within the resin component of resist compositions for ArF excimer lasers, KrF excimer lasers, or the like (and preferably for ArF excimer lasers) can be used.

In particular, at least one group selected from the group consisting of a tricyclodecanyl group, an adamantyl group, a tetracyclododecanyl group, an isobornyl group, and a norbornyl group are preferable in terms of industrial availability and the like. These polycyclic groups may contain a linear or branched alkyl group of 1 to 5 carbon atoms as a substituent.

Specific examples of the structural unit (a4) include a structural unit represented by the general formulae (a4-1) to (a4-5) shown below.

[Chemical Formula 30]

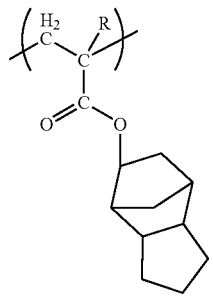

(a4-1)

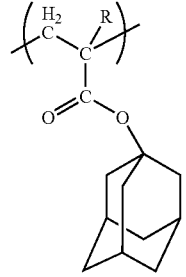

(a4-2)

(a4-3)
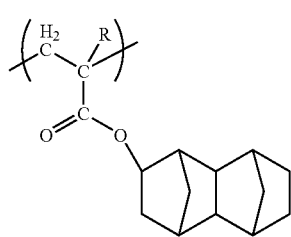

(a4-4)
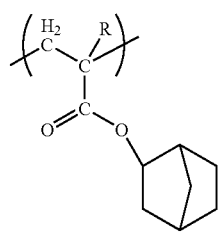

(a4-5)
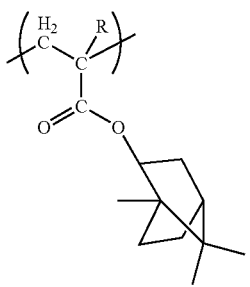

(In the formulae, R is the same as $R^1$ in the above general formula (a0-1).)

In the case of containing the structural unit (a4) in the polymeric compound (A1), the proportion of the structural unit (a4) in the polymeric compound (A1) is preferably 1 to 30 mol %, more preferably 10 to 20 mol %, based on the combined total of all the structural units that constitute the polymeric compound (A1).

The polymeric compound (A1) is preferably a copolymer containing at least the structural units (a0), (a2) and (a3). Examples of the copolymer include a copolymer consisting of the structural units (a0), (a2) and (a3); a copolymer consisting of the structural units (a0), (a2), (a3) and (a4); a copolymer consisting of the structural units (a0), (a2), (a3) and (a1); and a copolymer consisting of the structural units (a0), (a2), (a3), (a1) and (a4).

In the present invention, the polymeric compound (A1) is particularly preferably a copolymer containing three structural units represented by the general formula (A1-31) shown below, or a copolymer containing four structural units represented by the general formula (A1-41) shown below.

[Chemical Formula 31]

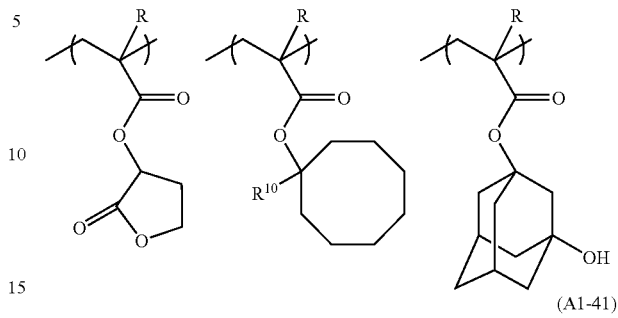

(A1-31)

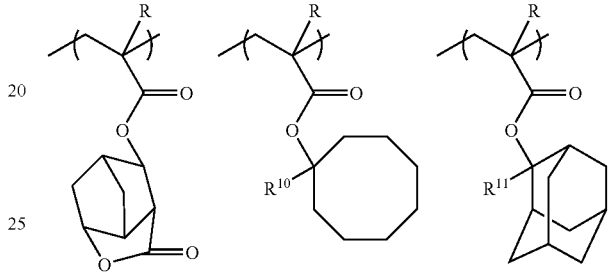

(A1-41)

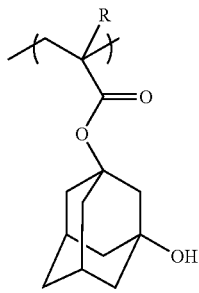

(In the formulae, R and $R^1$ each independently represents a hydrogen atom, a lower alkyl group or a halogenated lower alkyl group; $R^{10}$ represents a lower alkyl group; and $R^{11}$ represents a lower alkyl group.)

In the above formulae, examples of R and $R^1$ each include the same as $R^1$ in the above general formula (a0-1). Here, a plurality of R in the formulae may be the same, or may be different from each other.

Examples of the lower alkyl group for $R^{10}$ include the same lower alkyl groups as those described above for $R^1$ in the general formula (a0-1). Of these, a methyl group or an ethyl group is preferable, and an ethyl group is particularly preferable.

In the formula (A1-41), $R^{11}$ is the same as defined for $R^{11}$ in the above formula (a1-1-01). Of these, a methyl group or an ethyl group is preferable, and a methyl group is particularly preferable.

The polymeric compound (A1) can be obtained, for example, by a conventional radical polymerization or the like of the monomers corresponding with each of the structural units, using a radical polymerization initiator such as azobisisobutyronitrile (AIBN).

Also, in the polymeric compound (A1), by using a chain transfer agent such as $HS-CH_2-CH_2-CH_2-C(CF_3)_2-OH$ during the above polymerization, a $-C(CF_3)_2-OH$ group may be introduced at the terminals of the polymeric compound (A1). When a hydroxyalkyl group in which a part of the hydrogen atoms of the alkyl group has been substituted with fluorine atoms is introduced into a copolymer in this manner, the copolymer thus obtained can have an advantageous effect of reducing the levels of developing defects and LER (line edge roughness: unevenness of the line side walls).

There are no particular restrictions on the weight average molecular weight (Mw) (the polystyrene equivalent value determined by gel permeation chromatography (GPC), hereinafter defined as the same) of the polymeric compound (A1), and the weight average molecular weight of the polymeric compound (A1) is preferably 2,000 to 50,000, more preferably 3,000 to 30,000, and most preferably 5,000 to 20,000. By ensuring that the weight average molecular weight of the component (A1) is not more than the upper limit, solubility sufficient for a resist relative to a resist solvent can be obtained. By ensuring that it is not less than the lower limit, excellent dry-etching resistance and excellent cross-sectional shape of the resist pattern can be obtained.

Also, the dispersion degree (Mw/Mn) of the polymeric compound (A1) is preferably within the range of 1.0 to 5.0, more preferably 1.0 to 3.0, and most preferably 1.2 to 2.5. Herein, Mn means the number average molecular weight.

The polymeric compound (A1) of the present invention is a novel compound which has not been known conventionally.

If the polymeric compound (A1) is added to the positive resist composition together with an acid generator component (B) which generates an acid upon exposure, an acid is generated from the acid generator component (B) upon exposure (irradiation of a radiation). The acid acts to break the bond between the oxygen atom which is bonded to the carbonyl group of the structural unit (a0) and the tertiary carbon atom within the octyl ring to which the oxygen atom is bonded. Furthermore, if the polymeric compound (A1) further includes the structural unit (a1), an acid dissociable, dissolution inhibiting group within the structural unit (a1) also dissociates. As a result, solubility of the polymeric compound (A1) in an alkali developing solution can be increased.

Therefore, the polymeric compound (A1) is preferably used as the base resin for a chemically-amplified positive resist composition, and can be suitably used as the base component (A) in the positive resist composition of the present invention.

<<Positive Resist Composition>>

The positive resist composition of the present invention includes a base component (A) (hereinafter, referred to as component (A)) which exhibits increased solubility in an alkali developing solution under action of an acid, and an acid generator component (B) (hereinafter, referred to as component (B)) which generates an acid upon exposure. Here, the term "base component" means an organic compound which has a film-forming performance.

In the positive resist composition, an acid is generated from the component (B) when radiation is irradiated (exposed), and the acid acts to increase solubility of the component (A) in an alkali developing solution. Therefore, in the resist pattern formation, when a selective exposure is conducted to a resist film formed by using the positive resist composition, the exposed portions of the resist film exhibits increased solubility in an alkali developing solution, whereas the unexposed portions do not exhibit changed solubility in an alkali developing solution. As a result, a resist pattern can be formed by a following developing treatment with alkali.

<Component (A)>

The component (A) includes the polymeric compound (A1) of the present invention described above.

In the component (A), as the polymeric compound (A1), one type may be used alone, or two or more may be used in combination.

The proportion of the polymeric compound (A1) in the component (A) is preferably 50 to 100% by weight, more preferably 80 to 100% by weight, and may be 100% by weight, based on the total weight of the component (A).

The component (A) may contain "a base component which exhibits increased solubility in an alkali developing solution under action of an acid" (hereinafter, referred to as component (A2)) other than the aforementioned polymeric compound (A1), as long as the effects of the present invention are not impaired.

There are no particular restrictions on the component (A2), and any of the multitude of conventional base components used for chemically-amplified positive resist composition (for example, base resins for ArF excimer lasers or KrF excimer lasers (and preferably for ArF excimer lasers)), arbitrarily selected, can be used. Examples of the base resin for ArF excimer lasers include those which contains the aforementioned structural unit (a1) as an indispensable structural unit, and arbitrarily contains the aforementioned structural units (a2) to (a4).

As the component (A2), one type may be used alone, or two or more types may be used in combination.

<Component (B)>

There are no particular restrictions on the component (B), and those proposed as acid generators for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, an acid generator represented by the general formula (b-1) or (b-2) shown below can be used.

[Chemical Formula 32]

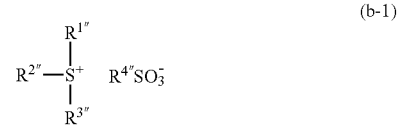

(b-1)

(b-2)

(In the formulae, $R^{1\prime\prime}$ to $R^{3\prime\prime}$, $R^{5\prime\prime}$ and $R^{6\prime\prime}$ each independently represents an aryl group or an alkyl group; two of $R^{1\prime\prime}$ to $R^{3\prime\prime}$ in the formula (b-1) may mutually be bonded to form a ring together with the sulfur atom in the formula; $R^{4\prime\prime}$ represents a linear, branched or cyclic alkyl group which may contain a substituent, or a linear, branched or cyclic fluorinated alkyl group which may contain a substituent; at least one of $R^{1\prime\prime}$ to $R^{3\prime\prime}$ represents an aryl group; and at least one of $R^{5\prime\prime}$ and $R^{6\prime\prime}$ represents an aryl group.)

In the general formula (b-1), $R^{1\prime\prime}$ to $R^{3\prime\prime}$ each independently represents an aryl group or an alkyl group. Here, two of $R^{1\prime\prime}$ to $R^{3\prime\prime}$ in the formula (b-1) may mutually be bonded to form a ring together with the sulfur atom in the formula.

Also, at least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

There are no particular restrictions on the aryl group for $R^{1\prime\prime}$ to $R^{3\prime\prime}$. For example, the aryl group may be an aryl group of 6 to 20 carbon atoms, and a part or all of the hydrogen atoms of the aryl group may be substituted with an alkyl group, an alkoxy group, a halogen atom, hydroxyl group or the like, or may be not substituted. The aryl group is preferably an aryl group of 6 to 10 carbon atoms because it can be synthesized inexpensively. Specific examples thereof include a phenyl group and a naphthyl group.

In the aryl group, the alkyl group with which hydrogen atoms may be substituted is preferably an alkyl group of 1 to 5 carbon atoms, and most preferably a methyl group, an ethyl group, a propyl group, an n-butyl group, or a tert-butyl group.

In the aryl group, the alkoxy group with which hydrogen atoms may be substituted is preferably an alkoxy group of 1 to 5 carbon atoms, and more preferably a methoxy group, an ethoxy group, an n-propoxy group, an iso-propoxy group, an n-butoxy group, or a tert-butoxy group.

In the aryl group, the alkoxy group with which hydrogen atoms may be substituted is most preferably a methoxy group or an ethoxy group.

In the aryl group, the halogen atom with which hydrogen atoms may be substituted is preferably a fluorine atom.

There are no particular restrictions on the alkyl groups for $R^{1'''}$ to $R^{3'''}$. Examples thereof include a linear, branched, or cyclic alkyl group of 1 to 10 carbon atoms. The alkyl group preferably has 1 to 5 carbon atoms, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

Of these, it is most preferable that $R^{1'''}$ to $R^{3'''}$ each be independently a phenyl group or a naphthyl group.

If two of $R^{1'''}$ to $R^{3'''}$ in the general formula (b-1) are mutually bonded to form a ring together with the sulfur atom in the formula, the ring including the sulfur atom preferably forms a 3 to 10-membered ring, and more preferably forms a 5 to 7-membered ring.

Also, if two of $R^{1'''}$ to $R^{3'''}$ in the general formula (b-1) are mutually bonded to form a ring together with the sulfur atom in the formula, the other of $R^{1'''}$ to $R^{3'''}$ is preferably an aryl group. As the aryl group, the same aryl groups as those described above for $R^{1'''}$ to $R^{3'''}$ can be used.

$R^{4'''}$ represents a linear, branched or cyclic alkyl group which may contain a substituent, or a linear, branched or cyclic fluorinated alkyl group which may contain a substituent.

The number of carbon atoms within the linear or branched alkyl group for $R^{4'''}$ is preferably 1 to 10, more preferably 1 to 8, and most preferably 1 to 4.

Examples of the cyclic alkyl group for $R^{4'''}$ include the same cyclic groups as those described above for $R^{1'''}$. The number of carbon atoms within the cyclic alkyl group for $R^{4'''}$ is preferably 4 to 15, more preferably 4 to 10, and most preferably 6 to 10.

The number of carbon atoms within the fluorinated alkyl group is preferably 1 to 10, more preferably 1 to 8, and most preferably 1 to 4. Furthermore, the fluorination rate of the fluorinated alkyl group (proportion of fluorine atoms in the alkyl group) is preferably within a range from 10 to 100%, and more preferably from 50 to 100%, and fluorinated alkyl groups (perfluoroalkyl groups) in which all hydrogen atoms are substituted with fluorine atoms are particularly preferable, because the strength of the acid increases.

$R^{4'''}$ is most preferably a linear or cyclic alkyl group, or a linear or cyclic fluorinated alkyl group.

Examples of the substituent which $R^{4'''}$ may contain include an aryl group, an alkenyl group, an aliphatic cyclic group, a group represented by the general formula: $R^{11'''}$—$CH_2$—O— (wherein, $R^{11'''}$ represents a monovalent aromatic organic group or an alkenyl group of 1 to 5 carbon atoms).

As the aryl group for the substituent, the same aryl groups as those described above for $R^{1'''}$ to $R^{3'''}$ can be used. Of these, a phenyl group or a naphthyl group is preferable.

The alkenyl group for the substituent is preferably an alkenyl group of 1 to 5 carbon atoms, and of these, a vinyl group or a propenyl group is preferable.

As the aliphatic cyclic group for the substituent, the same aliphatic cyclic groups as those described above in the explanation of "aliphatic cyclic group" can be used, and of these, an adamantyl group or a norbornyl group is preferable.

Examples of monovalent aromatic organic groups for $R^{11'''}$ include aryl groups in which one hydrogen atom has been removed from aromatic hydrocarbon rings, such as a phenyl group, a biphenyl group, a fluorenyl group, a naphthyl group, an anthryl group, and a phenanthryl group; heteroaryl groups in which a part of the carbon atoms constituting the ring(s) of these aryl groups is substituted with hetero atoms such as an oxygen atom, a sulfur atom, and a nitrogen atom; and arylalkyl groups such as a benzyl group and a phenethyl group. The number of carbon atoms of the alkyl chain in the arylalkyl group is preferably 1 to 4, more preferably 1 to 3, and still more preferably 1 to 2.

These aryl groups, heteroaryl groups, and arylalkyl groups may contain a substituent such as an alkyl group of 1 to 10 carbon atoms, a halogenated alkyl group, an alkoxy group, a hydroxyl group, and a halogen atom. The alkyl group or halogenated alkyl group for the substituent preferably has 1 to 8 carbon atoms, and more preferably 1 to 4 carbon atoms. Also, the halogenated alkyl group is preferably a fluorinated alkyl group. Examples of the halogen atom include a fluorine atom, a chlorine atom, an iodine atom, and a bromine atom. Of these, a fluorine atom is preferable.

The number of carbon atoms of the monovalent aromatic organic group for $R^{11'''}$ is preferably 6 to 20, more preferably 6 to 10, and still more preferably 10.

As the alkenyl group of 1 to 5 carbon atoms for $R^{11'''}$, a vinyl group or a propenyl group is preferable.

In the general formula (b-2), $R^{5'''}$ and $R^{6'''}$ each independently represents an aryl group or an alkyl group. At least one of $R^{5'''}$ and $R^{6'''}$ represents an aryl group. Both of $R^{5'''}$ and $R^{6'''}$ preferably represent aryl groups.

As the aryl groups for $R^{5'''}$ and $R^{6'''}$, the same aryl groups as those for $R^{1'''}$ to $R^{3'''}$ above can be used.

As the alkyl groups for $R^{5'''}$ and $R^{6'''}$, the same alkyl groups as those for $R^{1'''}$ to $R^{3'''}$ can be used.

Of these, it is most preferable that both of $R^{5'''}$ and $R^{6'''}$ be phenyl groups. Examples of $R^{4'''}$ in the general formula (b-2) include the same as those described above for $R^{4'''}$ in the general formula (b-1) can be used.

Specific examples of onium salt-based acid generators represented by formula (b-1) or (b-2) include diphenyliodonium trifluoromethanesulfonate or nonafluorobutanesulfonate; bis (4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4- methylphenyl)sulfonium trifluoromethanesulfonate, heptafluoropropanesulfonate or nonafluorobutanesulfonate; dimethyl(4- hydroxynaphthyl) sulfonium trifluoromethanesulfonate, heptafluoropropanesulfonate or nonafluorobutanesulfonate; monophenyldimethylsulfonium trifluoro methanesulfonate, heptafluoropropanesulfonate or nonafluorobutanesulfonate;

diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by methanesulfonate, n-propanesulfonate, n-butanesulfonate, or n-octanesulfonate.

Further, an onium salt-based acid generator in which the anion moiety in the general formula (b-1) or (b-2) is substituted with an anion moiety represented by the general formula (b-3) or (b-4) shown below can also be used. Here, the cation moiety is the same as those described in the general formula (b-1) or (b-2).

[Chemical Formula 33]

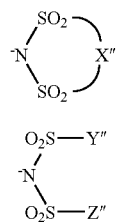

(In the formulae, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom.

The alkylene group for X" has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom. The alkyl group for Y" and Z" has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved, and thus it is consequently preferable.

Further, in the alkylene group for X" or the alkyl group for Y" and Z", it is preferable that the number of hydrogen atoms substituted with fluorine atoms be as large as possible, because the acid strength increases and the transparency to high energy radiation of 200 nm or less or electron beam is improved. The portion of the fluorine atom within the alkylene groups or alkyl groups, namely the fluorination ratio, is preferably within a range from 70 to 100%, and more preferably from 90 to 100%, and perfluoroalkylene groups or perfluoroalkyl groups in which all of the hydrogen atoms have been substituted with fluorine atoms are most preferable.

Furthermore, a sulfonium salt that contains a cation moiety represented by the general formula (b-5) or (b-6) shown below can be used as an onium salt-based acid generator.

[Chemical Formula 34]

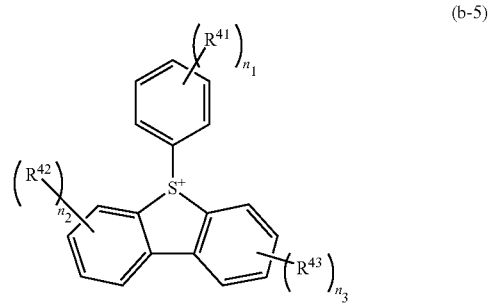

(In the formulae, $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.)

The alkyl group for $R^{41}$ to $R^{46}$ is preferably an alkyl group of 1 to 5 carbon atoms, more preferably a linear or branched alkyl group, and particularly preferably a methyl group, an ethyl group, a propyl group, an isopropyl group, an n-butyl group, or a tert-butyl group.

The alkoxy group for $R^{41}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ in the formulae (b-5) and (b-6) is preferably a group in which one or more hydrogen atoms of the alkyl group described above are substituted with hydroxyl groups, and examples thereof include a hydroxymethyl group, a hydroxyethyl group, and a hydroxypropyl group.

When the subscripts $n_1$ to $n_6$ attached at the bottom right of $R^{41}$ to $R^{46}$ represent an integer of 2 or more, a plurality of $R^{41}$ to $R^{46}$ may be the same or different from one another.

$n_1$ is preferably 0 to 2, more preferably 0 or 1, and still more preferably 0.

It is preferable that $n_2$ and $n_3$ each be independently 0 or 1, and it is more preferable that they be 0.

$n_4$ is preferably 0 to 2, and more preferably 0 or 1.

$n_5$ is preferably 0 or 1, and more preferably 0.

$n_6$ is preferably 0 or 1, and more preferably 1.

There are no particular restrictions on the anion moiety of a sulfonium salt that contains a cation moiety represented by the general formula (b-5) or (b-6), and anion moieties for onium salt-based acid generators which have been proposed may be used as the anion moieties. Examples of the anion moieties include a fluorinated alkylsulfonate ion such as the anion moiety ($R^{4'''}SO_3^-$) of the onium salt-based acid generator represented by the general formula (b-1) or (b-2); and an anion moiety represented by the above general formula (b-3) or (b-4). Of these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly preferable. Specific examples thereof include a trifluoromethylsulfonate ion, a heptafluoro-n-propylsulfonate ion, and a nonafluoro-n-butylsulfonate ion.

In the present specification, the term "oxime sulfonate-based acid generator" means a compound which has at least one of the groups represented by the general formula (B-1) shown below, and has a property that generates an acid upon exposure to radiation. These kinds of oxime sulfonate-based acid generators are widely used for a chemically-amplified resist composition, so any oxime sulfonate-based acid generator, arbitrarily selected from these, can be used.

[Chemical Formula 35]

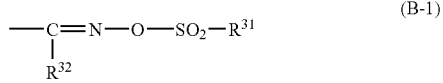

(B-1)

(In the general formula (B-1), $R^{31}$ and $R^{32}$ each independently represents an organic group.)

The organic group for $R^{31}$ and $R^{32}$ is a group containing carbon atoms, and may further contain atoms other than carbon atoms (for example, a hydrogen atom, an oxygen atom, a nitrogen atom, a sulfur atom or a halogen atom (a fluorine atom, a chlorine atom or the like)).

The organic group for $R^{31}$ is preferably a linear, branched or cyclic alkyl group or an aryl group. The alkyl group or aryl group may contain a substituent. There are no particular restrictions on the substituent, and examples thereof include a fluorine atom, and a linear, branched or cyclic alkyl group of 1 to 6 carbon atoms. Here, the term "containing a substituent" means that a part or all of the hydrogen atoms in the alkyl group or aryl group are substituted with substituents.

The alkyl group as the organic group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. The alkyl group for $R^{31}$ is particularly preferably an alkyl group which is partially or completely halogenated (hereinafter, sometimes referred to as a halogenated alkyl group). Here, a partially halogenated alkyl group means an alkyl group in which a part of the hydrogen atoms are substituted with halogen atoms, and a completely halogenated alkyl group means an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, the halogenated alkyl group is preferably a fluorinated alkyl group.

The aryl group as the aryl group for $R^{31}$ preferably has 4 to 20 carbon atoms, more preferably 4 to 10 carbon atoms, and most preferably 6 to 10 carbon atoms. The aryl group as the organic group for $R^{31}$ is particularly preferably an aryl group which is partially or completely halogenated. Here, a partially halogenated aryl group means an aryl group in which a part of the hydrogen atoms are substituted with halogen atoms, and a completely halogenated aryl group means an aryl group in which all of the hydrogen atoms are substituted with halogen atoms.

$R^{31}$ is particularly preferably an alkyl group of 1 to 4 carbon atoms containing no substituent, or a fluorinated alkyl group of 1 to 4 carbon atoms.

The organic group for $R^{32}$ is preferably a linear, branched or cyclic alkyl group, an aryl group, or a cyano group. The alkyl group or aryl group for $R^{32}$ includes the same alkyl groups or aryl groups as those described above for $R^{31}$.

$R^{32}$ is particularly preferably a cyano group, an alkyl group of 1 to 8 carbon atoms containing no substituent, or a fluorinated alkyl group of 1 to 8 carbon atoms.

Preferred examples of the oxime sulfonate-based acid generator include compounds represented by the general formula (B-2) or (B-3) shown below.

[Chemical Formula 36]

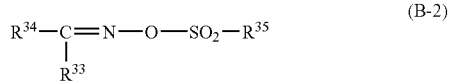

(B-2)

(In the general formula (B-2), $R^{33}$ represents a cyano group, an alkyl group containing no substituent, or a halogenated alkyl group; $R^{34}$ represents an aryl group; and $R^{35}$ represents an alkyl group containing no substituent or a halogenated alkyl group.)

[Chemical Formula 37]

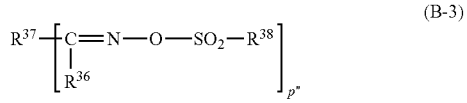

(B-3)

(In the formula (B-3), $R^{36}$ represents a cyano group, an alkyl group containing no substituent, or a halogenated alkyl group; $R^{37}$ represents a bivalent or trivalent aromatic hydrocarbon group; $R^{38}$ represents an alkyl group containing no substituent or a halogenated alkyl group; and p" represents an integer of 2 or 3.)

In the general formula (B-2), the alkyl group containing no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which a part of the carbon atoms which constitute the rings of these groups are substituted with heteroatoms such as an oxygen atom, a sulfur atom, and a nitrogen atom. Of these, a fluorenyl group is preferable.

The aryl group for $R^{34}$ may contain a substituent such as an alkyl group of 1 to 10 carbon atoms, a halogenated alkyl group of 1 to 10 carbon atoms, and an alkoxy group of 1 to 10 carbon atoms. The number of carbon atoms in the alkyl group or halogenated alkyl group for the substituent is preferably from 1 to 8, and more preferably 1 to 4. Also, the halogenated alkyl group is preferably a fluorinated alkyl group.

The alkyl group containing no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), examples of the alkyl group containing no substituent or the halogenated alkyl group for $R^{36}$ include the same as those described above in the alkyl group containing no substituent or the halogenated alkyl group for $R^{33}$ in the above general formula (B-2).

Examples of the bivalent or trivalent aromatic hydrocarbon group for $R^{37}$ include aryl groups for $R^{34}$ in which one or two hydrogen atoms are further removed.

In the general formula (B-3), examples of the alkyl group containing no substituent or the halogenated alkyl group for $R^{38}$ include the same as the alkyl group containing no substituent or the halogenated alkyl group for $R^{35}$ in the above general formula (B-2).

p" is preferably 2.

Specific examples of the oxime sulfonate-based acid generator include

α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyanide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitrile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-(propylsulfonyloxyimino)-p-methylphenylacetonitrile, and
α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and International Publication WO 2004/074242A2 (Examples 1 to 40 on pages 65 to 85) can be preferably used.

Further, suitable examples thereof include the following.

[Chemical Formula 38]

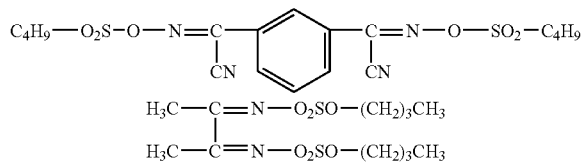

[Chemical Formula 39]

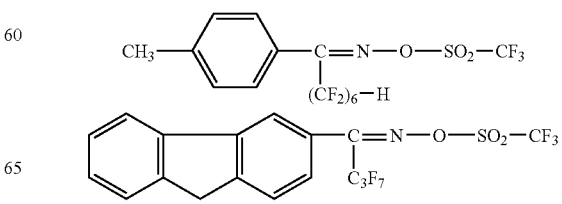

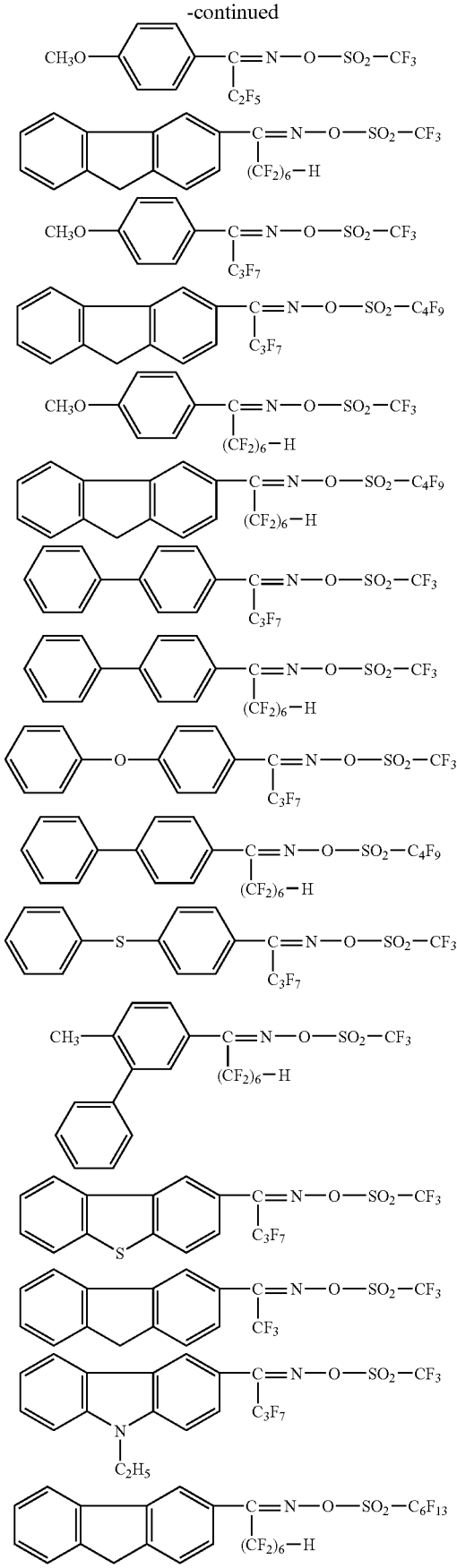

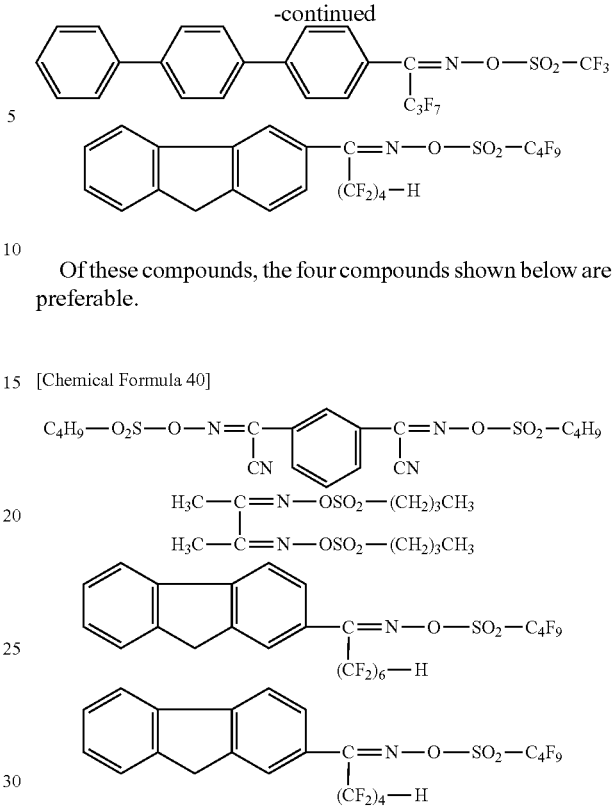

Of these compounds, the four compounds shown below are preferable.

[Chemical Formula 40]

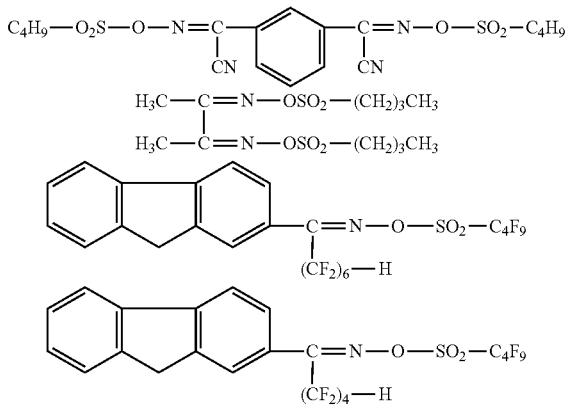

Among the diazomethane-based acid generators, specific examples of bisalkyl- or bisarylsulfonyldiazomethanes include bis(isopropylsulfonyl)diazomethane, bis(p-toluene-sulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei11-035551, Japanese Unexamined Patent Application, First Publication No. Hei11-035552, and Japanese Unexamined Patent Application, First Publication No. Hei11-035573 can be preferably used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B), either a single acid generator may be used alone, or a combination of two or more different acid generators may be used.

In the present invention, of these, onium salts with a fluorinated alkylsulfonate ion as the anion are preferably used as the component (B).

The amount of the component (B) within the positive resist composition of the present invention is preferably 0.5 to 30 parts by weight, and more preferably 1 to 10 parts by weight, relative to 100 parts by weight of the component (A). When the amount is within the range, a pattern can be sufficiently formed. Also, a uniform solution and excellent storage stability can be obtained. Therefore, an amount within the above range is preferable.

<Optional Components>

In the positive resist composition of the present invention, in order to improve the resist pattern shape and the post exposure stability of the latent image formed by the pattern-wise exposure of the resist layer, a nitrogen-containing organic compound (D) (hereinafter, referred to as component (D)) can be included in the positive resist composition as an optional component.

Since a multitude of these components (D) have already been proposed, any of these known compounds can be arbitrarily used. Of these, an aliphatic amine, particularly a secondary aliphatic amine or tertiary aliphatic amine is preferred. Here, the term "aliphatic" in the claims and specification is a relative concept used in relation to the term "aromatic", and defines a group or compound or the like that contains no aromaticity.

The term "aliphatic cyclic group" means a monocyclic or polycyclic group that contains no aromaticity. An aliphatic amine is an amine having one or more aliphatic groups, and the aliphatic groups preferably have 1 to 12 carbon atoms.

Examples of the aliphatic amine include an amine (alkylamine or alkylalcoholamine) wherein at least one of the hydrogen atoms of $NH_3$ is substituted with an alkyl or hydroxyalkyl group having 12 or less carbon atoms; and a cyclic amine.

Specific examples of the alkylamines and alkylalcoholamines include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkylalcoholamines such as diethanolamine, triethanolamine, diisopropanolamine, triisopropanolamine, di-n-octanolamine, or tri-n-octanolamine. Of these, alkylalcoholamines or trialkylamines are preferable, and trialkylamines are more preferable. Among tiralkylamines, trialkylamines of 5 to 10 carbon atoms are still more preferable, and tri-n-pentylamine is most preferable.

Examples of the cyclic amine include a heterocyclic compound containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amines include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These may be used either alone, or in combination of two or more different compounds.

The component (D) is typically used in a quantity within the range of 0.01 to 5.0 parts by weight, relative to 100 parts by weight of the component (A).

In the positive resist composition of the present invention, in order to prevent any deterioration in sensitivity, and improve the resist pattern shape and the post exposure stability of the latent image formed by the pattern-wise exposure of the resist layer, at least one compound (E) selected from the group consisting of organic carboxylic acids and phosphorus oxo acids or derivatives thereof (hereinafter, referred to as component (E)) can also be added as an optional component.

Suitable examples of organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

As the component (E), an organic carboxylic acid is preferable, and salicylic acid is particularly preferable.

The component (E) is used in a quantity within a range of 0.01 to 5.0 parts by weight, relative to 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can appropriately be added.

The positive resist composition of the present invention can be prepared by dissolving materials in an organic solvent (hereinafter, sometimes referred to as component (S)).

The component (S) may be an organic solvent which can dissolve the respective components used in the present invention to give a uniform solution, and one or more kinds of organic solvents can be used, appropriately selected from those which have been conventionally known as a solvent for a chemically-amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, dipropylene glycol; compounds having ester bonds such as ethylene glycol monoacetate, diethylene glycol monoacetate, propylene glycol monoacetate and dipropylene glycol monoacetate; and polyhydric alcohol derivatives including compounds having ether bonds such as monoalkyl ethers (for example, monomethyl ether, monoethyl ether, monopropyl ether and monobutyl ether) and monophenyl ether of the above polyhydric alcohols or the above compounds having ester bonds (of these, propylene glycol monomethyl ether acetate (PGMEA) or propylene glycol monomethyl ether (PGME) is preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, and mesitylene.

These organic solvents may be used either alone, or may be used as a mixed solvent of two or more different solvents.

Of these, as the component (S), propylene glycol monomethyl ether acetate (PGMEA), propylene glycol monomethyl ether (PGME) or EL is preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within the range of 1:9 to 9:1, and more preferably 2:8 to 8:2.

More specifically, in the case of using EL as the polar solvent, the mass ratio PGMEA:EL is preferably within the range of 1:9 to 9:1, and more preferably 2:8 to 8:2. Furthermore, in those cases of using PGME as the polar solvent, the mass ratio PGMEA:PGME is preferably within the range of 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within a range from 70:30 to 95:5.

There are no particular restrictions on the quantity of the component (S), and the quantity should be set in accordance with the required coating film thickness within a concentration that enables favorable application of the solution to a substrate or the like. Typically, the quantity is set so that the solid fraction concentration within the resist composition falls within the range of 2 to 20% by weight, and preferably 3 to 15% by weight.

The positive resist composition of the present invention is a novel resist composition which has not been known conventionally.

Moreover, according to the positive resist composition of the present invention, a resist pattern with reduced levels of LWR can be formed. Furthermore, the positive resist composition of the present invention also attains satisfactory sensitivity and resolution.

<<Method of Forming Resist Pattern>>

A method of forming a resist pattern of the present invention includes: forming a resist film on a substrate using the positive resist composition of the present invention described above; exposing the resist film; and alkali-developing the resist film to form a resist pattern.

The method of forming a resist pattern of the present invention can be performed, for example, in the following manner. Firstly, the positive resist composition is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, a developing treatment is conducted using an alkali developing solution such as a 0.1 to 10% by mass aqueous solution of tetramethylammonium hydroxide (TMAH), preferably followed by rinsing with pure water, and drying. Also, according to circumstances, a bake treatment (post bake) may be conducted after the above developing treatment. In this manner, a resist pattern that is faithful to the mask pattern can be obtained.

The substrate is not specifically limited and a conventionally known substrate can be used. Examples thereof include substrates for electronic parts, and substrates for electronic parts on which a predetermined wiring pattern has already been formed. Specific examples thereof include a silicon wafer; a substrate made of a metal such as copper, chromium, iron and aluminum; and a substrate made of glass. As materials for the wiring pattern, for example, copper, aluminum, nickel or gold can be used.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic anti-reflection film (organic BARC) can be used.

There are no particular restrictions on the wavelength used for the exposure, and the exposure can be conducted using radiation such as ArF excimer lasers, KrF excimer lasers, $F_2$ excimer lasers, extreme ultraviolet rays (EUV), vacuum ultraviolet rays (VUV), electron beams (EB), X-rays, and soft X-rays. Of these, the positive resist composition is effective for KrF excimer lasers, ArF excimer lasers, EB or EUV, and particularly effective for ArF excimer lasers.

EXAMPLES

Next, the present invention will be described in more detail with reference to examples, but the scope of the present invention is not limited to the following examples.

In Examples 1 to 2 and Comparative Examples 1 to 2 below, compounds (1) to (6) represented by the formulae (1) to (6) shown below were used as the monomers.

[Chemical Formula 41]

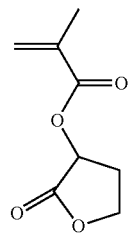

(1)

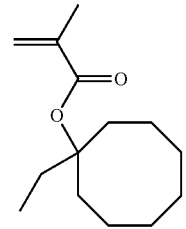

(2)

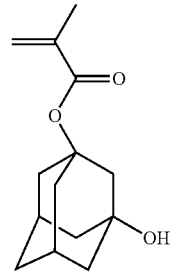

(3)

(4)

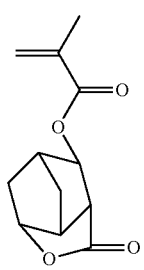

(5)

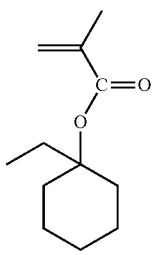

(6)

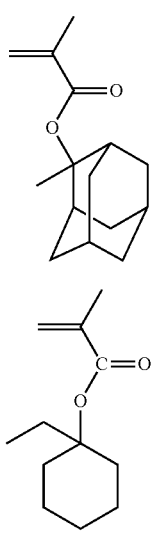

[Chemical Formula 42]

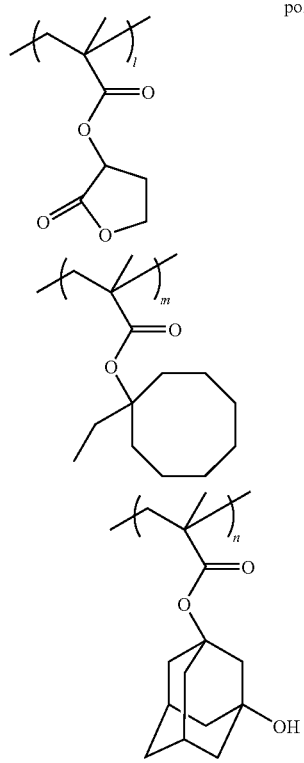

polymeric compound 1

Example 1

17.00 g of the compound (1), 22.40 g of the compound (2), and 11.80 g of the compound (3) were dissolved in 76.80 g of ethyl lactate. 15 mmol of V-601 (product name, manufactured by Wako Pure Chemical Industries, Ltd.) (radical polymerization initiator; dimethyl 2,2'-azobis(2-methylpropionate)) was added to the above solution, and then dissolved. The solution thus obtained was dropwise added to 42.67 g of ethyl lactate heated at 80° C. under a nitrogen atmosphere for 6 hours. After the dropwise adding treatment, the reaction solution was stirred on heating for 1 hour, and then cooled down at room temperature. Thereafter, the steps of dropwise adding the reaction solution to a large amount of methanol/water solution and precipitating a copolymer were repeated twice. The copolymer thus obtained was dried under reduced pressure at room temperature, thereby obtaining .a white powder. This is referred to as polymeric compound 1, and the chemical structural formula is shown below.

The carbon 13 nuclear magnetic resonance spectrum ($^{13}$C-NMR) of the polymeric compound 1 was measured. As a result, the polymer formulation (the proportion (molar ratio) of each structural unit in the chemical structural formula) was "l/m/n=41.0/40.5/18.5". Also, the weight average molecular weight (Mw) (the polystyrene equivalent value determined by gel permeation chromatography (GPC)) was 5,900, and the dispersion degree was 1.67.

Example 2

17.76 g of the compound (4), 3.58 g of the compound (2), 9.36 g of the compound (5) and 5.67 g of the compound (3) were dissolved in 145.44 g of methyl ethyl ketone. 8.8 mmol of V-601 (product name, manufactured by Wako Pure Chemical Industries, Ltd.) (radical polymerization initiator) was added to the above solution, and then dissolved. The solution thus obtained was dropwise added to 60.61 g of methyl ethyl ketone heated at 80° C. under a nitrogen atmosphere for 6 hours. After the dropwise adding treatment, the reaction solution was stirred whilst heating for 1 hour, and then cooled down at room temperature. Thereafter, the steps of dropwise adding the reaction solution to a large amount of methanol/water solution and precipitating a copolymer were repeated twice. The copolymer thus obtained was dried under reduced pressure at room temperature, thereby obtaining a white powder. This is referred to as polymeric compound 7, and the chemical structural formula is shown below.

The carbon 13 nuclear magnetic resonance spectrum ($^{13}$C-NMR) of the polymeric compound 7 was measured. As a result, the polymer formulation (the proportion (molar ratio) of each structural unit in the chemical structural formula) was "l/m/n/o=52.2/9.4/22.3/16.1". Also, the weight average molecular weight (Mw) (the polystyrene equivalent value determined by gel permeation chromatography (GPC)) was 6,400, and the dispersion degree was 1.61.

[Chemical Formula 43]

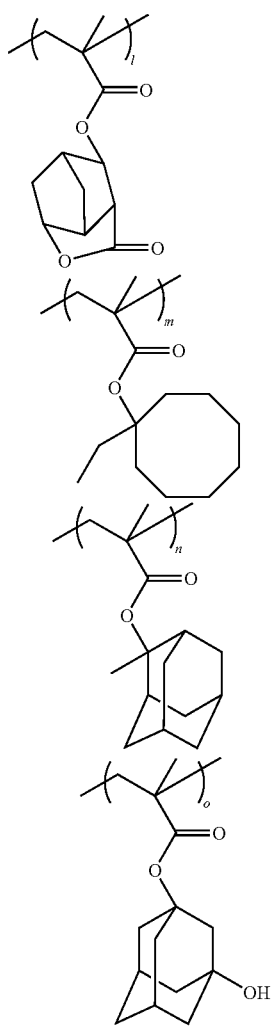

polymeric compound 7

Comparative Example 1

17.00 g of the compound (1), 19.60 g of the compound (6), and 11.80 g of the compound (3) were dissolved in 72.60 g of ethyl lactate. 15 mmol of V-601 (product name, manufactured by Wako Pure Chemical Industries, Ltd.) (radical polymerization initiator) was added to the above solution, and then dissolved. The solution thus obtained was dropwise added to 40.33 g of ethyl lactate heated at 80° C. under a nitrogen atmosphere for 6 hours. After the dropwise adding treatment, the reaction solution was stirred on heating for 1 hour, and then cooled down at room temperature. Thereafter, the steps of dropwise adding the reaction solution to a large amount of methanol/water solution and precipitating a copolymer were repeated twice. The copolymer thus obtained was dried under reduced pressure at room temperature, thereby obtaining a white powder. This is referred to as polymeric compound 10, and the chemical structural formula is shown below.

The carbon 13 nuclear magnetic resonance spectrum ($^{13}$C-NMR) of the polymeric compound 10 was measured. As a result, the polymer formulation (the proportion (molar ratio) of each structural unit in the chemical structural formula) was "l/m/n=43.0/40.0/17.0". Also, the weight average molecular weight (Mw) (the polystyrene equivalent value determined by gel permeation chromatography (GPC)) was 5,800, and the dispersion degree was 1.60.

[Chemical Formula 44]

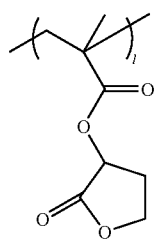

polymeric compound 10

Comparative Example 2

17.76 g of the compound (4), 3.14 g of the compound (6), 9.36 g of the compound (5) and 5.67 g of the compound (3) were dissolved in 143.68 g of methyl ethyl ketone. 8.8 mmol of V-601 (product name, manufactured by Wako Pure Chemical Industries, Ltd.) (radical polymerization initiator) was added to the above solution, and then dissolved. The solution thus obtained was dropwise added to 59.87 g of methyl ethyl ketone heated at 80° C. under a nitrogen atmosphere for 6 hours. After the dropwise adding treatment, the reaction solution was stirred whilst heating for 1. hour, and then cooled down at room temperature. Thereafter, the steps of dropwise adding the reaction solution to a large amount of methanol/water solution and precipitating a copolymer were repeated twice. The copolymer thus obtained was dried under reduced pressure at room temperature, thereby obtaining a white powder. This is referred to as polymeric compound 11, and the chemical structural formula is shown below.

The carbon 13 nuclear magnetic resonance spectrum ($^{13}$C-NMR) of the polymeric compound 11 was measured. As a result, the polymer formulation (the proportion (molar ratio) of each structural unit in the chemical structural formula) was "l/m/n/o=52.0/9.0/24.5/14.5". Also, the weight average molecular weight (Mw) (the polystyrene equivalent value determined by gel permeation chromatography (GPC)) was 7,500, and the dispersion degree was 1.72.

[Chemical Formula 45]

polymeric compound 11

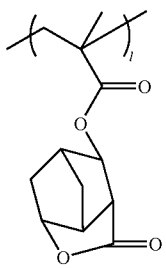

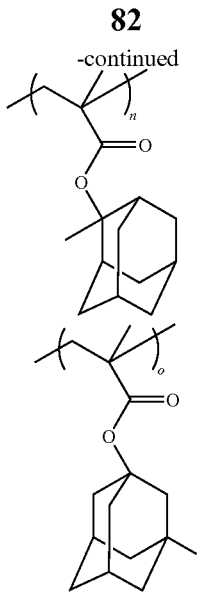

Examples 3 to 4, and Comparative Examples 3 to 4

The components shown in Table 1 are mixed and dissolved, thereby providing a positive resist composition.

TABLE 1

|  | Component (A) | Component (B) | | Component (D) | Component (E) | Component (S) | |
| --- | --- | --- | --- | --- | --- | --- | --- |
| Example 3 | (A)-1 | (B)-1 | (B)-2 | (D)-1 | (E)-1 | (S)-1 | (S)-2 |
|  | [100] | [2] | [7.5] | [0.5] | [1.32] | [10] | [2200] |
| Comparative Example 3 | (A')-1 | (B)-1 | (B)-2 | (D)-1 | (E)-1 | (S)-1 | (S)-2 |
|  | [100] | [2] | [7.5] | [0.5] | [1.32] | [10] | [2200] |
| Example 4 | (A)-2 | (B)-1 | (B)-2 | (D)-1 | (E)-1 | (S)-1 | (S)-2 |
|  | [100] | [2] | [7.5] | [0.5] | [1.32] | [10] | [2200] |
| Comparative Example 4 | (A')-2 | (B)-1 | (B)-2 | (D)-1 | (E)-1 | (S)-1 | (S)-2 |
|  | [100] | [2] | [7.5] | [0.5] | [1.32] | [10] | [2200] |

In Table 1, the abbreviations mean the following. Also, the values within the brackets [ ] mean the blending amount (parts by weight).
(A)-1: the polymeric compound 1 of Example 1.
(A')-1: the polymeric compound 10 of Comparative Example 1.
(A)-2: the polymeric compound 7 of Example 2.
(A')-2: the polymeric compound 11 of Comparative Example 2.
(B)-1: triphenylsulfonium heptafluoro-n-propanesulfonate.
(B)-2: di(1-naphthyl)phenylsulfonium nonafluoro-n-butanesulfonate.
(D)-1: tri-n-pentylamine.
(E)-1: salicylic acid.
(S)-1: γ-butyrolactone.
(S)-2: a mixed solvent of PGMEA/PGME = 6/4 (mass ratio).

-continued

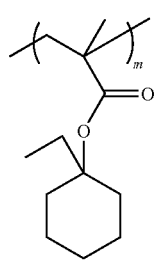

The following evaluations were performed using the positive resist composition solutions thus obtained.
<Formation of Resist Pattern>

An organic anti-reflection film composition (product name: ARC95, manufactured by Brewer Science Ltd.) was applied onto an 8-inch silicon wafer using a spinner, and the composition was then baked on a hotplate at 205° C. for 60 seconds, thereby forming an organic anti-reflection film having a film thickness of 77 nm.

Then, each of the positive resist compositions obtained above was applied onto the organic anti-reflection film using a spinner, and was then prebaked (PAB) on a hotplate at a temperature shown in Table 2 for 60 seconds and dried, thereby forming a resist film having a film thickness of 150 nm.

Subsequently, the obtained resist film was selectively exposed to an ArF excimer laser (193 nm) through a mask pattern, using an ArF exposure apparatus "NSR-S302" (product name, manufactured by Nikon; numerical aperture (NA)= 0.60, 2/3 annual illumination). A post exposure baking (PEB) treatment was then conducted for 60 seconds at a temperature shown in Table 2, the resist film was subjected to alkali developing for 30 seconds at 23° C. in a 2.38% by weight aqueous solution of tetramethylammonium hydroxide (TMAH), and was then rinsed with pure water for 30 seconds and dried by shaking.

As a result, in each example, a line and space resist pattern (hereinafter, referred to as "L/S pattern") with a line width of 120 nm and a pitch of 240 nm was formed.

The optimum exposure (Eop: (mJ/cm$^2$)) for forming a line and space pattern (L/S pattern) with a line width of 120 nm and a pitch of 240 nm, that is, the sensitivity was determined. The results are shown in Table 2.

<Evaluation of LWR>

In each L/S pattern formed by using the above Eop, the line width was measured at 5 locations along the line direction using a measuring SEM (scanning electron microscope, accelerating voltage: 800 V, product name: S-9220, manufactured by Hitachi, Ltd.). From these results, the value of 3 times the standard deviation (s) (namely, 3s) was calculated as a indicator of the LWR. The results are shown in Table 2.

The smaller this 3s value is, the lower the level of roughness within the line width, indicating the formation of a resist pattern with a more uniform width.

TABLE 2

|  | PAB temperature (° C.) | PEB temperature (° C.) | Eop (mJ/cm$^2$) | LWR (nm) |
| --- | --- | --- | --- | --- |
| Example 3 | 130 | 130 | 10 | 11.0 |
| Comparative Example 3 | 110 | 110 | 21 | 12.5 |
| Example 4 | 130 | 130 | 16 | 17.0 |
| Comparative Example 4 | 120 | 120 | 29 | 18.0 |

As is clear from the results shown in Table 2, the positive resist composition of Example 3 using the polymeric compound 1 could form a resist pattern with a more uniform width, when compared with the positive resist composition of Comparative Example 3 using the polymeric compound 10, in spite of the fact that both of the polymeric compounds 1 and 10 were three-component copolymers.

Also, the positive resist composition of Example 4 using the polymeric compound 7 could form a resist pattern with a more uniform width, when compared with the positive resist composition of Comparative Example 4 using the polymeric compound 11, in spite of the fact that both of the polymeric compounds 7 and 11 were four-component copolymers.

INDUSTRIAL APPLICABILITY

According to the present invention, a novel polymeric compound which can be used in a positive resist composition, a positive resist composition, and a method of forming a resist pattern using the positive resist composition can be provided.

The invention claimed is:

1. A positive resist composition comprising a base component (A) which exhibits increased solubility in an alkali developing solution under action of an acid, and an acid generator component (B) which generates an acid upon exposure, wherein
the base component (A) comprises a polymeric compound (A1) containing a structural unit (a0) represented by the general formula (a0-1) shown below and a structural unit (a3) derived from an acrylate ester which has a polar group-containing aliphatic polycyclic group, wherein the polar group comprises at least one member selected from the group consisting of a hydroxyl group, a cyano group, a carboxyl group, and a hydroxyalkyl group in which at least one hydrogen atom in an alkyl group is substituted with a fluorine atom:

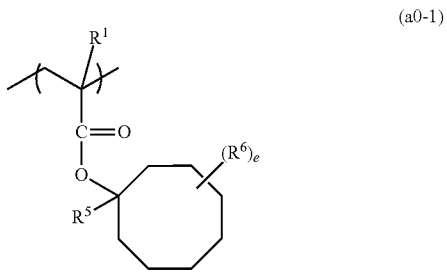

(a0-1)

wherein $R^1$ represents a hydrogen atom, a lower alkyl group, or a halogenated lower alkyl group; $R^5$ represents an alkyl group; $R^6$ represents a substituent selected from the group consisting of an alkyl group, an alkoxy group, a halogen atom and a halogenated alkyl group; and e represents an integer of 0 to 5.

2. The positive resist composition according to claim 1, wherein the polymeric compound (A1) further comprises a structural unit (a2) derived from an acrylate ester which has a lactone-containing cyclic group.

3. The positive resist composition according to claim 1, wherein the polymeric compound (A1) further comprises a structural unit (a1) which is different than the structural unit (a0) and is derived from an acrylate ester which has an acid dissociable, dissolution inhibiting group.

4. The positive resist composition according to claim 1, further comprising a nitrogen-containing organic compound (D).

5. A method of forming a resist pattern, comprising: forming a resist film on a substrate using the positive resist composition of claim 1; exposing the resist film; and alkali-developing the resist film to form a resist pattern.

* * * * *